(12) United States Patent
Lee

(10) Patent No.: US 7,087,489 B2
(45) Date of Patent: Aug. 8, 2006

(54) METHOD OF FABRICATING TRAP TYPE NONVOLATILE MEMORY DEVICE

(75) Inventor: Chang-Hyun Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/429,153

(22) Filed: May 1, 2003

(65) Prior Publication Data

US 2003/0211692 A1 Nov. 13, 2003

(30) Foreign Application Priority Data

May 7, 2002 (KR) .................. 10-2002-0025014

(51) Int. Cl.
 *H01L 21/336* (2006.01)
(52) U.S. Cl. ............... 438/258; 257/314; 257/E21.683
(58) Field of Classification Search ........ 438/257–267; 257/314–320, E29.129, E29.3, E21.179, 257/E21.422, E21.68, E21.681, E21.683, 257/E21.686, E21.687, E21.688, E21.684
See application file for complete search history.

(56) References Cited

U.S. PATENT DOCUMENTS

| | | | | |
|---|---|---|---|---|
| 3,635,774 A | * | 1/1972 | Ohta ........................ | 438/702 |
| 5,087,584 A | * | 2/1992 | Wada et al. ............... | 438/262 |
| 5,104,819 A | * | 4/1992 | Freiberger et al. ......... | 438/593 |
| 5,235,187 A | * | 8/1993 | Arney et al. ............... | 250/306 |
| 5,366,590 A | * | 11/1994 | Kadomura ................. | 438/723 |
| 5,672,539 A | * | 9/1997 | Thakur et al. .............. | 438/443 |
| 5,723,355 A | * | 3/1998 | Chang et al. ............... | 438/275 |
| 5,856,221 A | * | 1/1999 | Clementi et al. ........... | 438/258 |
| 5,885,903 A | * | 3/1999 | Torek et al. ................ | 438/756 |
| 5,898,258 A | * | 4/1999 | Sakai et al. ................ | 313/309 |
| 6,117,730 A | * | 9/2000 | Komori et al. ............. | 438/258 |
| 6,465,306 B1 | * | 10/2002 | Ramsbey et al. .......... | 438/279 |
| 6,642,573 B1 | * | 11/2003 | Halliyal et al. ............ | 257/316 |
| 6,656,808 B1 | * | 12/2003 | Kwean ....................... | 438/305 |
| 2002/0197800 A1 | * | 12/2002 | Hashimoto et al. ........ | 438/266 |

\* cited by examiner

*Primary Examiner*—Brooke Kebede
(74) *Attorney, Agent, or Firm*—Marger Johnson & McCollom, P.C.

(57) ABSTRACT

A method of forming a trap type nonvolatile memory device is disclosed. The method includes forming a cell gate insulating layer on a semiconductor substrate. The semiconductor substrate includes a peripheral circuit region and a cell array region. A sacrificial pattern is formed on the cell gate insulating layer to cover the cell array region. The cell gate insulating layer in the peripheral circuit region is then etched using the sacrificial pattern as an etch mask to expose the semiconductor substrate in the peripheral circuit region. The cell gate insulating layer includes a lower insulating layer, a charge storage layer, and an upper insulating layer. Also, the upper insulating layer and the sacrificial pattern are made of material layers having an etch selectivity with respect to each other. The upper insulating layer is made of a metal oxide layer having an etch selectivity with respect to the sacrificial pattern.

34 Claims, 29 Drawing Sheets

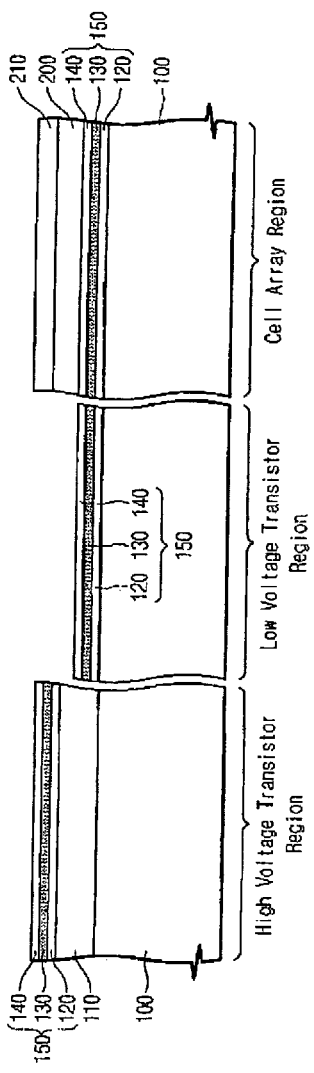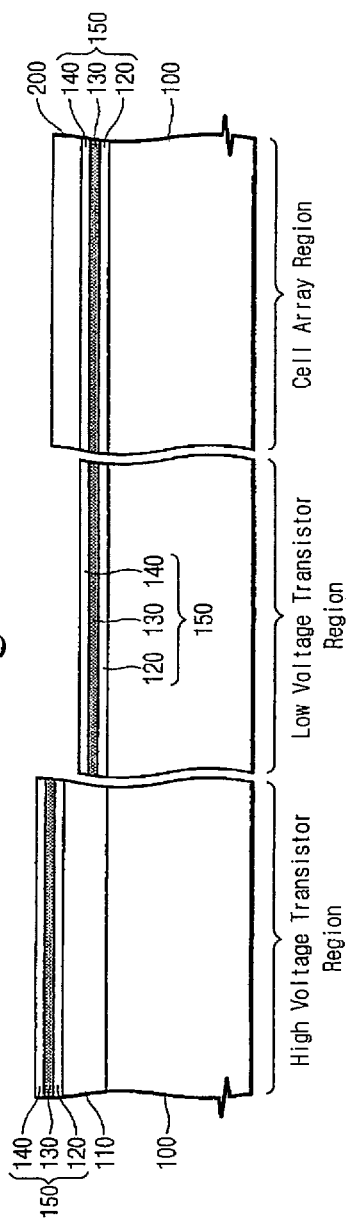

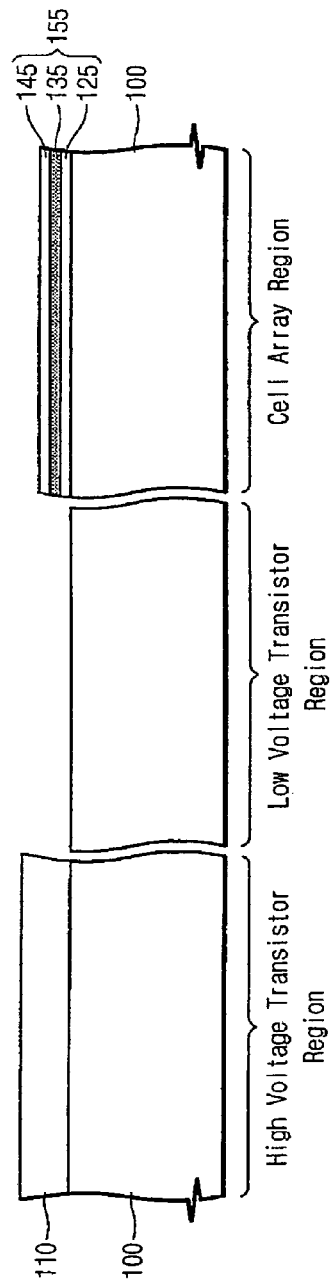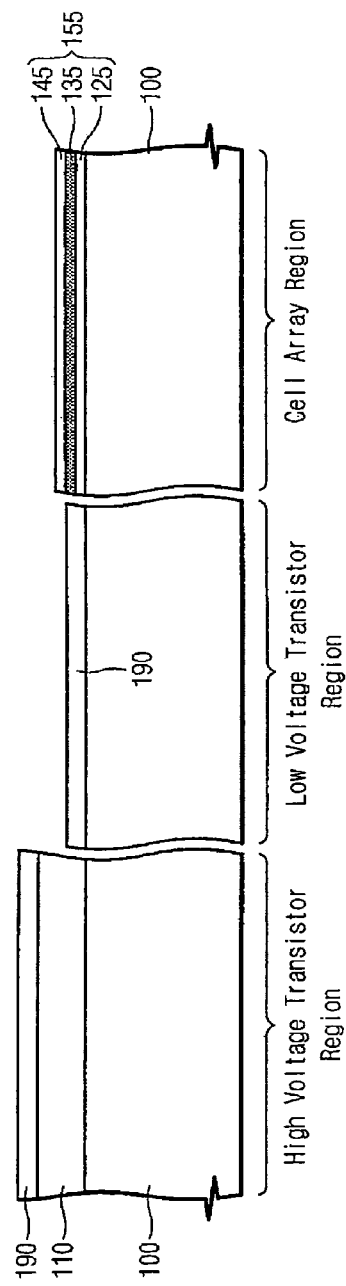

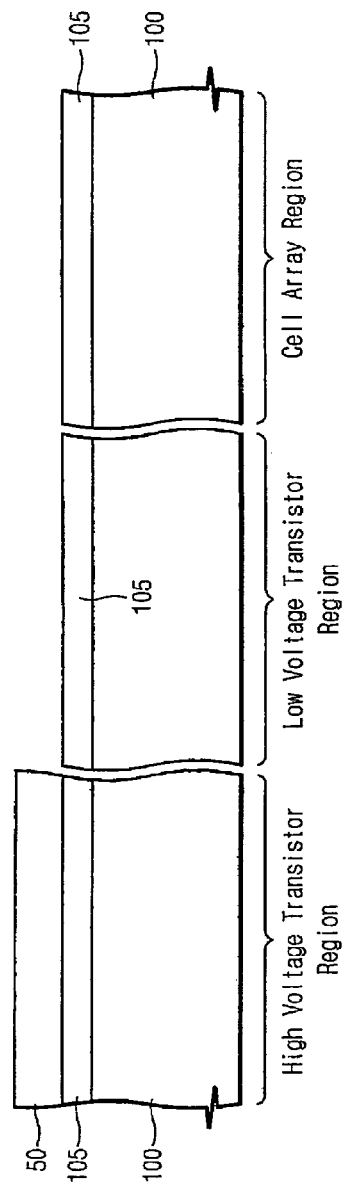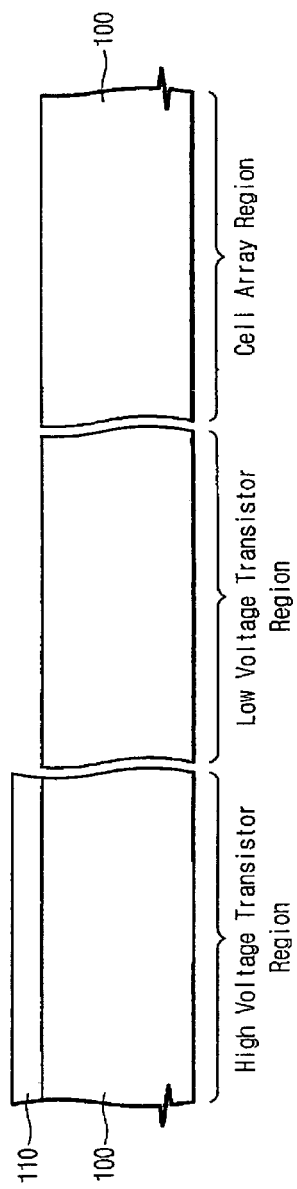

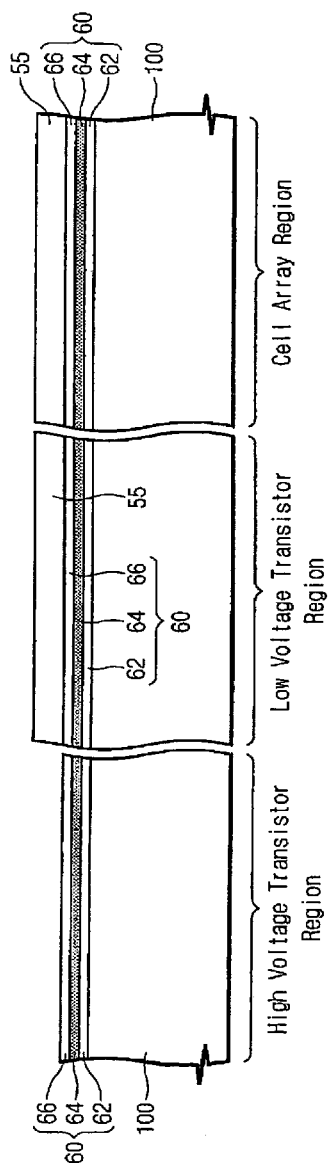
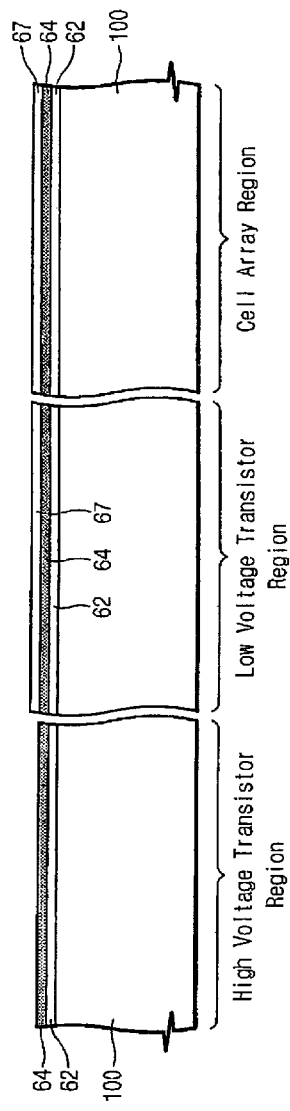

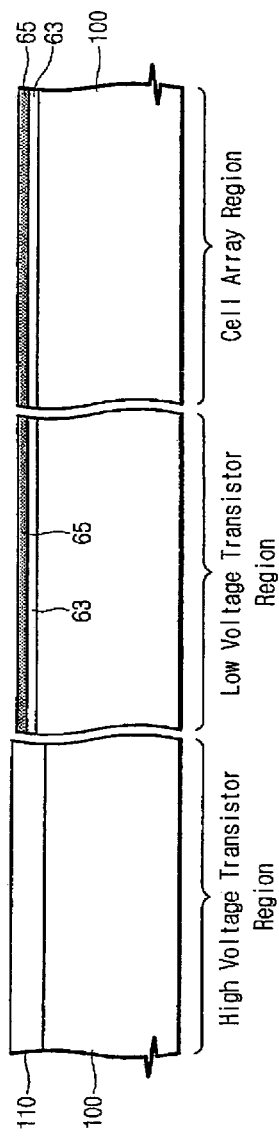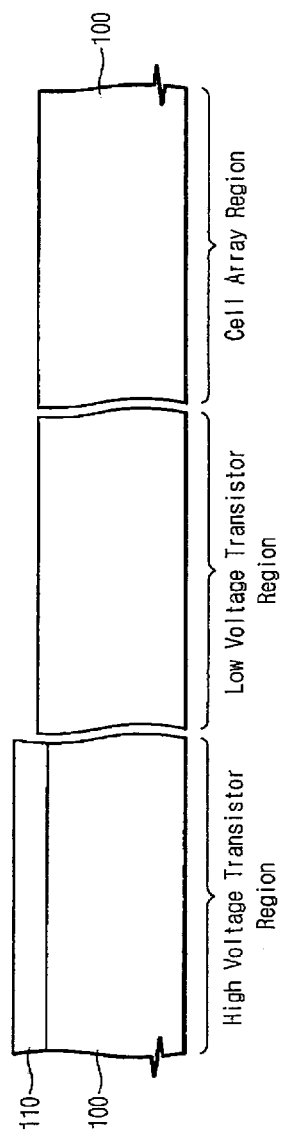

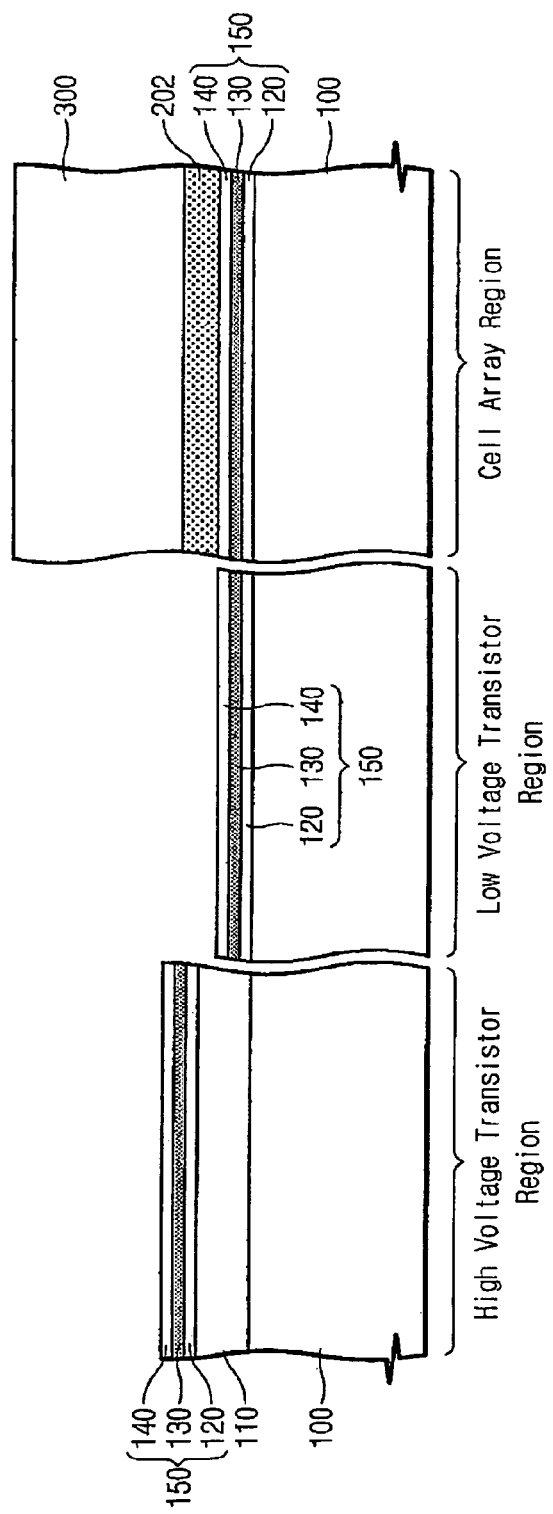

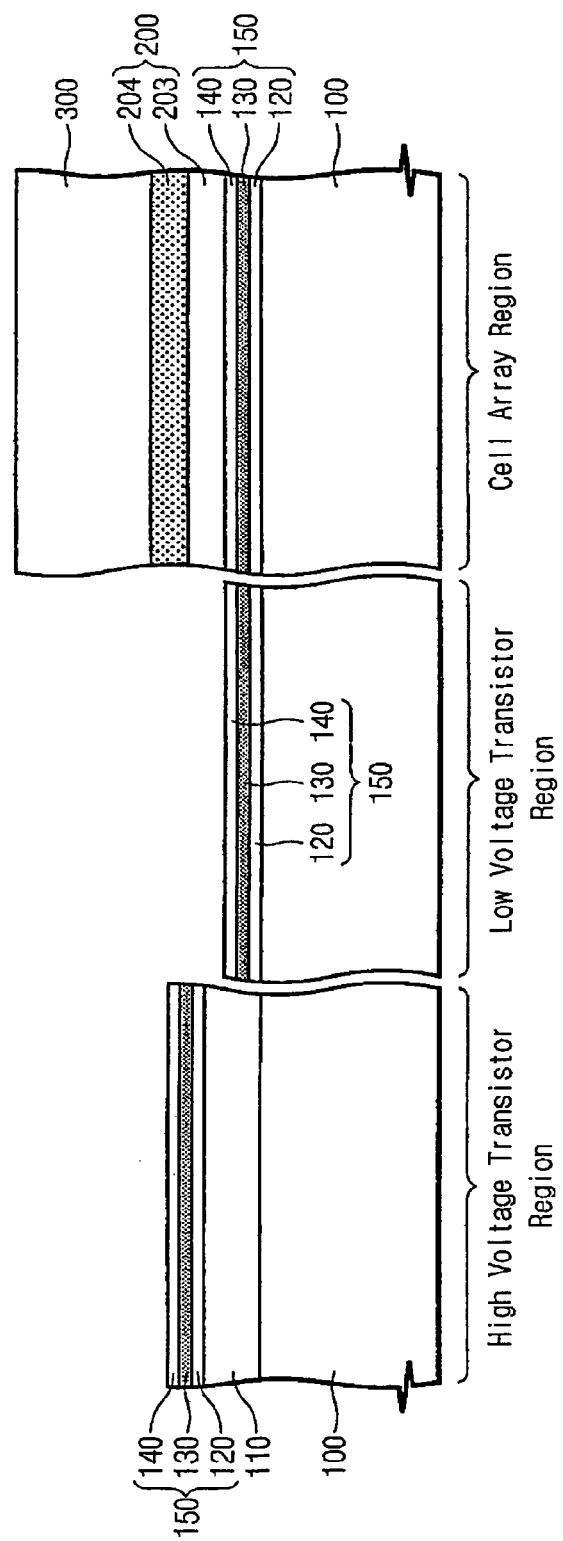

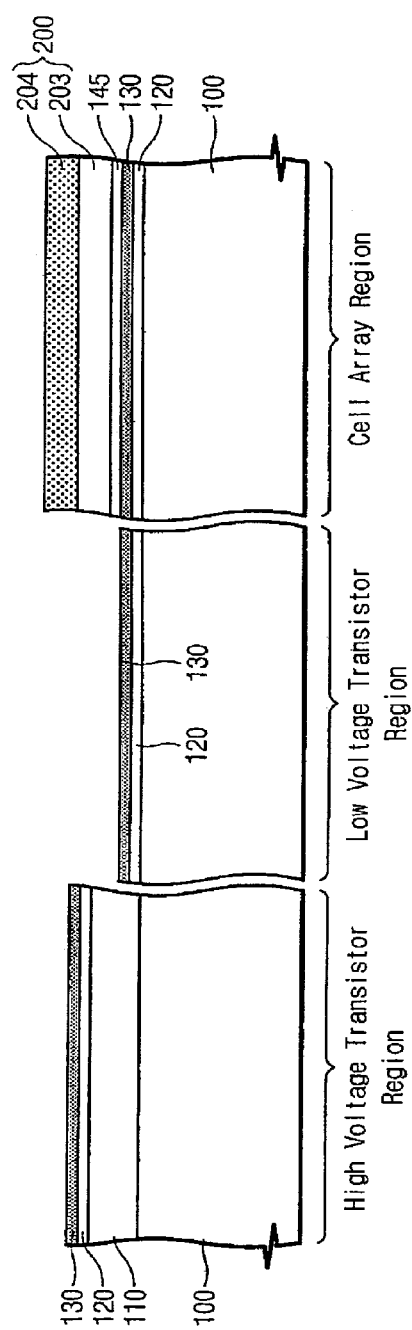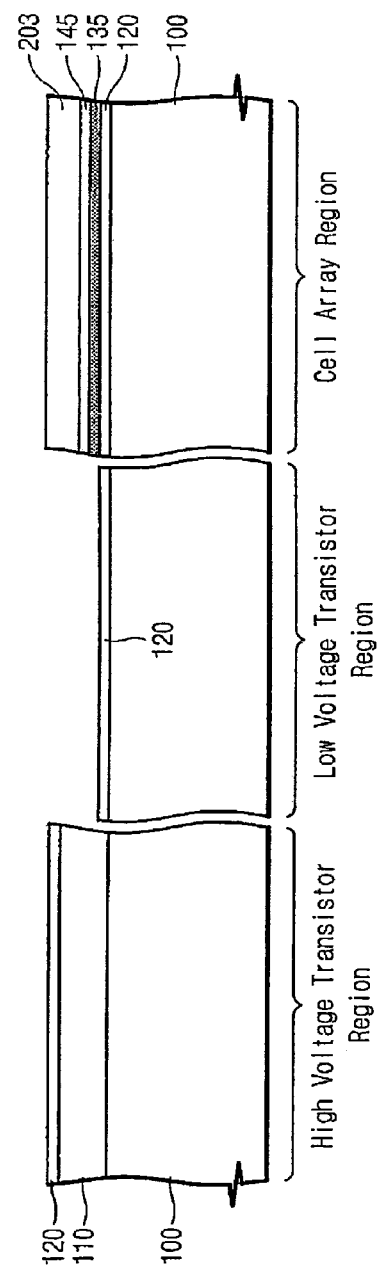

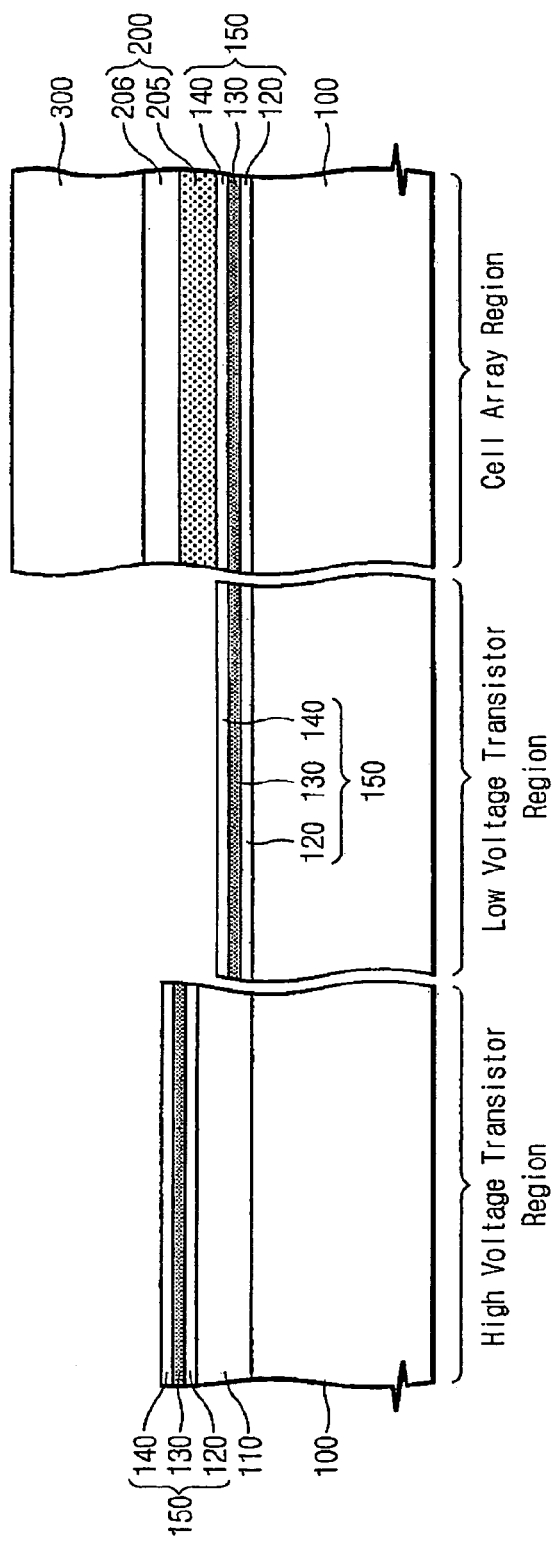

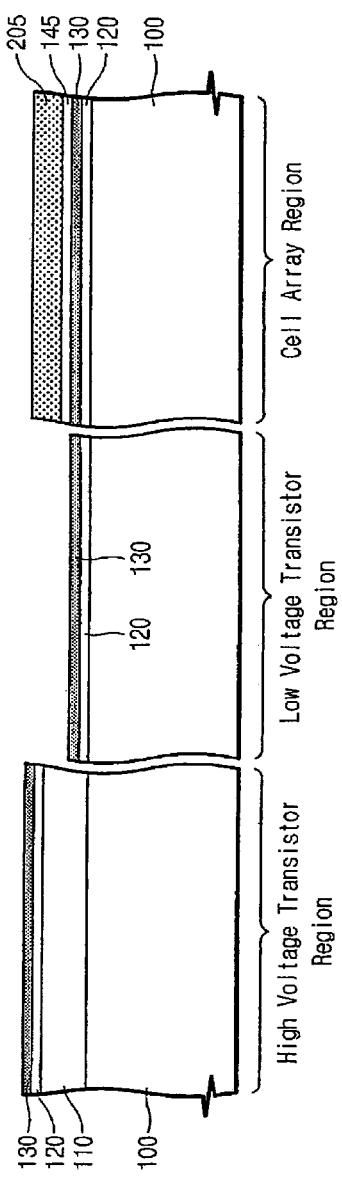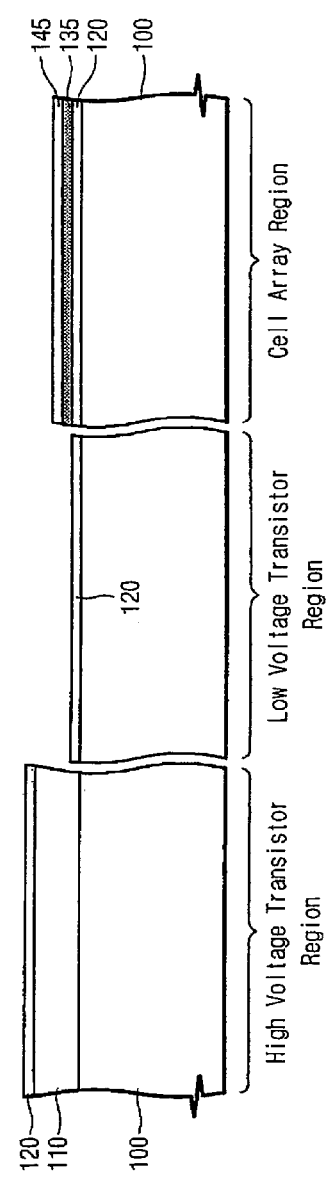

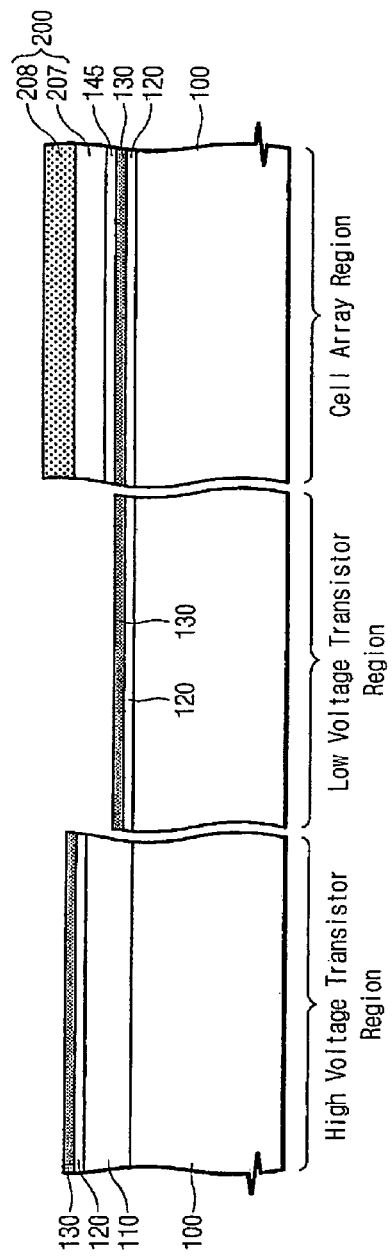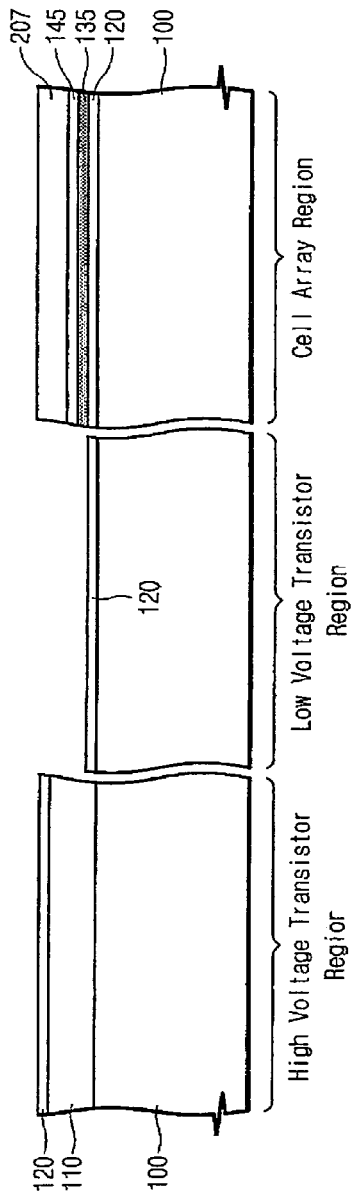

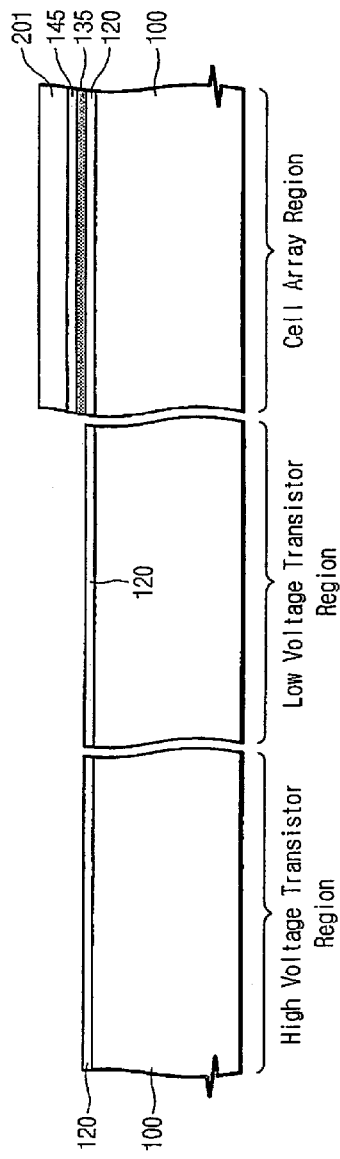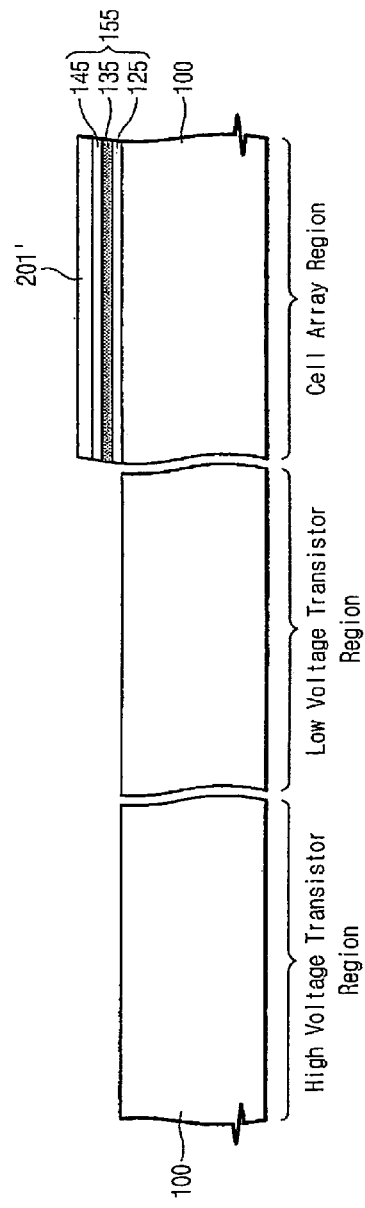

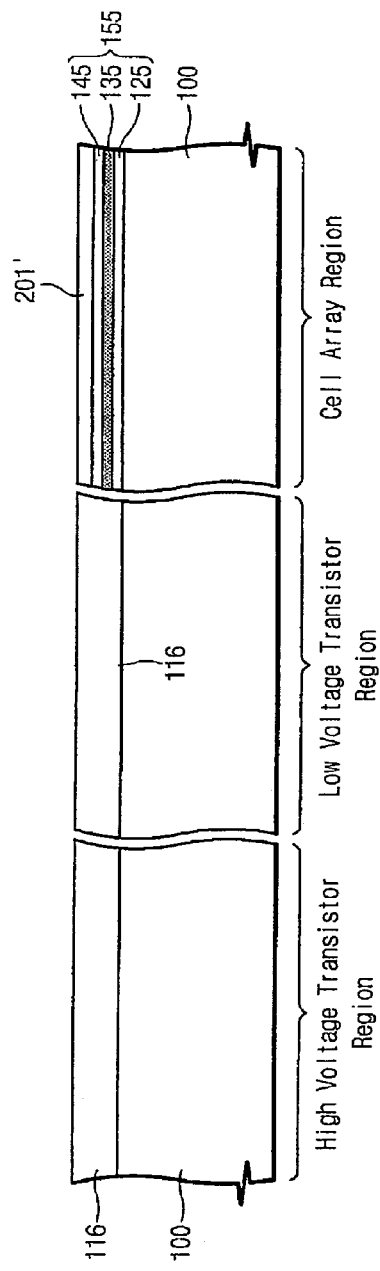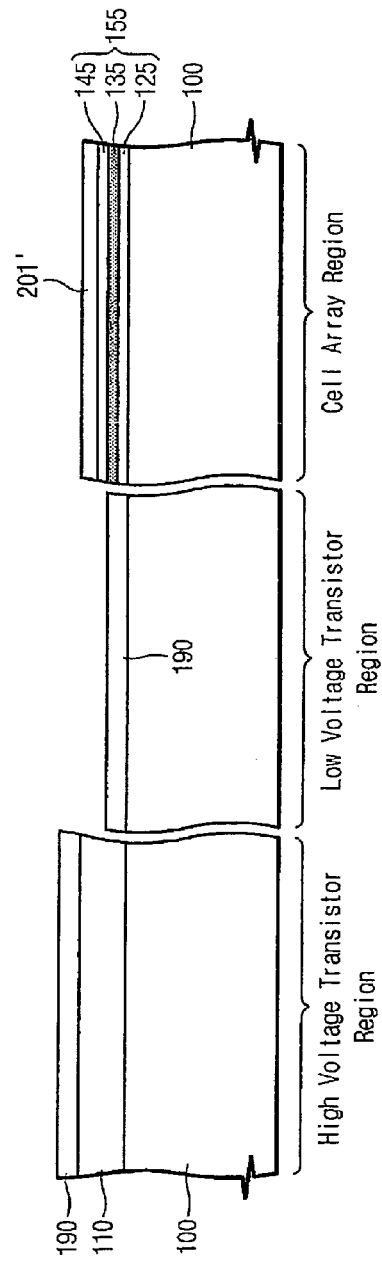

METHOD OF FABRICATING TRAP TYPE NONVOLATILE MEMORY DEVICE

CROSS REFERENCE TO RELATED APPLICATIONS

This application claims priority from Korean Patent Application No. 2002-25014, filed on May 7, 2002, the contents of which are hereby incorporated by reference in their entirety.

BACKGROUND OF THE INVENTION

1. Technical Field of the Invention

The invention relates to a method of fabricating a semiconductor device. More particularly, the invention is directed to a method of fabricating a nonvolatile memory device in which a high-k dielectric layer is used as an upper insulating layer of a cell gate insulating layer.

2. Description of the Related Art

Generally, a semiconductor memory device includes a plurality of cell transistors and function circuits for operating the cell transistors. The semiconductor memory device may be categorized as either volatile memory devices or nonvolatile memory devices depending on whether stored information can be retained when their power supplies are interrupted. The volatile memory device is classified into a dynamic random access memory (DRAM) and a static random access memory (SRAM). The nonvolatile memory device is classified into a read only memory (ROM), an erasable and programmable ROM (EPROM), and an electrically erasable and programmable ROM (EEPROM). Recently, demand for the EEPROM has been increasing with the trend toward portability and miniaturization of electronic appliances.

A typical type of EEPROM is a floating gate type flash memory device having an electrically isolated conductive pattern (i.e., a floating gate). In order to change information stored in the cell transistor, Fowler-Nordheim (F-N) tunneling is used in the floating gate type flash memory device. F-N tunneling is a quantum-mechanical phenomenon caused by a high potential difference. Low voltage transistors and high voltage transistors are used for the function circuit of the floating gate type flash memory device. Generally, the high voltage transistor has a junction region of a DDD structure, and the low voltage transistor has a junction region of a LDD structure. Also, the high voltage transistor has a thick gate insulating layer as compared to the low voltage transistor. Accordingly, the floating gate type flash memory device includes three different gate insulating layers for the cell transistor, the high voltage transistor and the low voltage transistor.

Generally, in order to simplify processes, oxide layers are used as the gate insulating layer in the low voltage transistor and the cell transistor. Here, the oxide layers are simultaneously formed to have a uniform thickness. Thus, the floating gate type flash memory device includes two gate insulating layers, i.e., a low voltage gate insulating layer used in the cell transistor and the low voltage transistor and a high voltage gate insulating layer used in the high voltage transistor.

Meanwhile, another type of the EEPROM is a trap type flash memory device in which an insulating layer is used as a charge storage structure instead of the floating gate. The trap type flash memory device includes a cell gate insulating layer composed of a lower silicon oxide layer, a silicon nitride layer, and an upper silicon oxide layer, which are sequentially stacked. Here, the silicon nitride layer is used as a charge storage layer of the trap type flash memory device. Unlike the floating gate type flash memory device, a low voltage gate insulating layer cannot be used as the cell gate insulating layer in the trap type flash memory device. Accordingly, the trap type flash memory device should include the gate insulating layers having three different thicknesses.

In the trap type flash memory device, a method of forming the gate insulating layer having three different thicknesses includes forming the high voltage gate insulating layer at the high voltage transistor region. Thereafter, the cell gate insulating layer is formed on an entire surface of a semiconductor substrate. The cell gate insulating layer is patterned to form a cell gate insulating pattern covering the cell transistor region and exposing the low voltage transistor region and the high voltage transistor region. Next, the low voltage gate insulating layer is formed at the exposed semiconductor substrate in the low voltage transistor region.

During a process of patterning the cell gate insulating layer, photolithography and etching processes are performed using a photoresist layer. In this case, the upper silicon oxide layer is thin. Thus, the upper silicon oxide layer is damaged or its thickness thereof is reduced during the photolithographic process and a subsequent process of removing the photoresist layer. Therefore, characteristics of the trap type flash memory device may be degraded.

BRIEF DESCRIPTION OF THE DRAWINGS

FIGS. 1 through 6 are cross-sectional views showing a method of forming a gate insulating layer of a nonvolatile memory device according to a preferred embodiment of the invention.

FIGS. 7A and 7B are cross-sectional views showing a method of forming a high voltage gate insulating pattern according to one embodiment of the invention.

FIGS. 8A through 8D, 9A through 9C, 10A through 10C, 11A through 11C, 12A through 12C, and 13A through 13C are cross-sectional views for explaining a method of forming the gate insulating layer according to different embodiments of the invention.

FIGS. 14 through 20 are cross-sectional views showing a method of forming the gate insulating layer of the nonvolatile memory device according to another preferred embodiment of the invention.

DETAILED DESCRIPTION OF THE INVENTION

Figure 1:
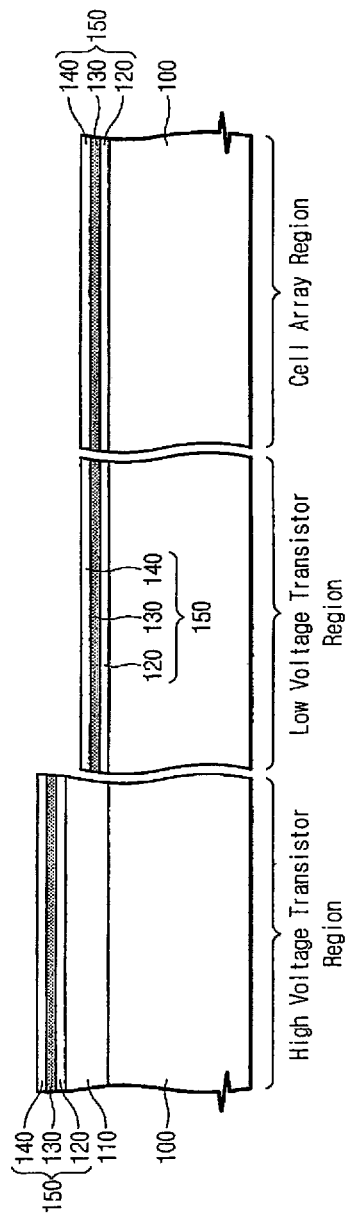

The invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 1 through 6 are cross-sectional views showing a method of forming a gate insulating layer of a nonvolatile memory device according to a preferred embodiment of the invention.

Referring to FIG. 1, a device isolation layer (not shown) is formed at a predetermined region of a semiconductor substrate to define a high voltage transistor region, a low voltage transistor region, and a cell array region. Preferably, the device isolation layer is formed by a typical trench method. Also, after forming the gate insulating layer of the invention, the device isolation layer may be formed by using a self-aligned trench method. Here, the high voltage transistor region and the low voltage transistor region constitute a peripheral circuit region.

A high voltage gate insulating layer 110 is formed on the semiconductor substrate 100 in the high voltage transistor region. A cell gate insulating layer 150 is conformally formed on an entire surface of a semiconductor substrate having the high voltage gate insulating layer 110. The cell gate insulating layer 150 is composed of a lower insulating layer 120, a charge storage layer 130 and an upper insulating layer 140, which are sequentially stacked.

Preferably, the high voltage gate insulating pattern 110 is made of a silicon oxide layer formed by a thermal process. A method for forming the high voltage gate insulating pattern 110 will be described in detail with reference to FIGS. 7A and 7B, and 8A through 8D.

Preferably, the lower insulating layer 120 is made of a silicon oxide layer having a thickness of 20~40 Å. The lower insulating layer 120 is preferably formed by a thermal oxidization process and may be formed by a chemical vapor deposition (CVD) method.

In the nonvolatile memory device according to the invention, the charge storage layer 130 is used as a material layer for storing charges. Accordingly, the charge storage layer 130 is made of the material layer. The material layer has an energy level enough to trap electrons or holes and has an energy band structure in which the trapped electrons may be confined by the upper insulating layer 140 and the lower insulating layer 120. For this, the charge storage layer 130 is preferably made of a silicon nitride layer and may be made of a silicon oxynitride layer. Here, the charge storage layer 130 is preferably formed by an atomic layer deposition (ALD) method and the CVD method. The charge storage layer 130 has a thickness of 60~100 Å.

Preferably, the upper insulating layer 140 is made of a material layer having the energy band structure in which the trapped electrons can be confined in the charge storage layer 130. Also, preferably, the upper insulating layer 140 is made of the material layer capable of increasing a coupling ratio that is an important parameter in the typical nonvolatile memory device. Additionally, the upper insulating layer 140 is preferably made of a material layer capable of preventing the damage of a layer and the reduction in thickness, which was already described in the conventional method. In order to satisfy these conditions, the upper insulating layer 140 is made of a metal oxide layer, and preferably composed of one selected from the group consisting of high-k dielectric materials such as a aluminum oxide layer, a hafnium oxide layer, a hafnium aluminum oxide layer, and a hafnium silicon oxide layer. Further, the upper insulating layer 140 may be formed of oxide materials of at least one element selected from Group III or VB of a periodic table. In addition, the upper insulating layer 140 may include at least one element selected from Group IV of the periodic table as impurities.

After forming the upper insulating layer 140, the thermal process may be further performed at a temperature of about 750~1100° C. by using gases such as $NH_3$, $N_2$ and NO in order to crystallize the upper insulating layer 140.

Figure 2:
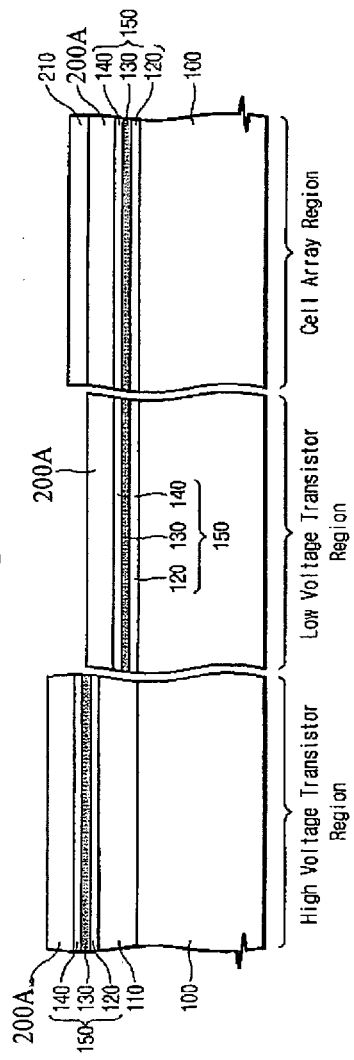

Referring to FIGS. 2–4, a sacrificial pattern 200 is formed on the cell gate insulating layer 150 to expose the peripheral circuit region.

Forming the sacrificial pattern 200 includes sequentially stacking a sacrificial layer 200A and a photoresist layer on the cell gate insulating layer 150. Thereafter, the photoresist layer is patterned by a typical photolithographic process to form a photoresist pattern 210 exposing the sacrificial layer 200A in the peripheral circuit region. The sacrificial layer is patterned using the photoresist pattern as an etch mask to form the sacrificial pattern 200 exposing the cell gate insulating layer 150 in the peripheral circuit region. After forming the sacrificial pattern 200, the photoresist pattern 210 is removed.

Preferably, the sacrificial pattern 200 is composed of one material layer selected from the group consisting of the silicon oxide layer, the silicon nitride layer, the silicon oxynitride layer and a polysilicon layer. It is possible to modify several embodiments according to the type of material layer used as the sacrificial pattern 200. Among the several embodiments that will be described, the photoresist pattern may not be removed in this step. That is, the photoresist pattern is used as an etch mask for etching the cell gate insulating layer 150, and then may be removed in a subsequent process. These modified embodiments regarding the types of the sacrificial pattern 200 and a removal of the photoresist pattern will be described in detail with reference to FIGS. 9 through 14.

Referring to FIG. 5, the exposed cell gate insulating layer 150 in the peripheral circuit insulating pattern 155 is composed of a lower insulating pattern 125, a charge storage pattern 135, and an upper insulating pattern 145 that are sequentially stacked to be formed. The cell gate insulating pattern 155 exposes a top surface of the semiconductor substrate 100 in the low voltage transistor region and a top surface of the high voltage gate insulating layer 110 in the high voltage transistor region.

An etching process for forming the cell gate insulating pattern 155 is performed using an etchant that has an etch characteristic with respect to the material layers. These etch characteristics are summarized in the following table.

TABLE 1

| | etch characteristics according to types of material layers | | | |
|---|---|---|---|---|
| Etchant | Silicon oxide layer | Silicon nitride layer | Metal oxide layer | Polysilicon layer |
| fluoric acid | good | poor | poor | good (when nitrogen is added) |
| LAL | good | poor | good | poor |
| sulphuric acid | poor | poor | good | poor |
| phosphoric acid | poor | good | poor | poor |

In accordance with the etch characteristics according to the types of the material layers and the several types of the sacrificial pattern 155 of the table 1, the invention may be embodied by several methods. These several embodiments will be described in detail with reference to FIGS. 9 through 14.

Referring to FIG. 6, a low voltage gate insulating layer 190 is formed on the semiconductor substrate 100 exposed at the low voltage transistor region.

Preferably, the low voltage gate insulating layer 190 is made of the silicon oxide layer formed by the thermal oxidization process. In this case, the low voltage gate insulating layer 190 may be formed on the high voltage gate insulating pattern 110 at the high voltage transistor region. Accordingly, it is preferable that the process of forming the high voltage gate insulating pattern 110 described in FIG. 1 is carried out in consideration of a thickness of the low gate insulating layer 190 and thickness variation occurring in typical cleaning processes.

During the thermal oxidization process for forming the low voltage gate insulating layer 190, the upper insulating layer 140 and the charge storage layer 130 prevent oxygen from penetrating the semiconductor substrate 100. Thus, the low voltage gate insulating layer 190 is not formed at the cell array region.

FIGS. 7A and 7B are cross-sectional views showing an embodiment for explaining the high voltage gate insulating pattern 110 of FIG. 1.

Referring to FIG. 7A, a high voltage gate insulating pattern 105 is formed on the semiconductor substrate 100. Preferably, the high voltage gate insulating layer 105 is made of the silicon oxide layer formed by the thermal oxidization process. Also, the high voltage gate insulating layer 105 is formed in consideration of the thickness of the low gate insulating layer 190 and the thickness variation occurring in cleaning processes implemented during the subsequent process. Preferably, a thickness of the high voltage gate insulating layer 105 is adjusted so that the sum of the thickness of the low voltage gate insulating layer 190 and the thickness of the high voltage gate insulating pattern 110 may be approximately 300 Å.

A photoresist pattern 50 is formed on the high voltage gate insulating layer 105 to expose the high voltage gate insulating layers 105 at the low voltage transistor region and the cell array region.

Referring to FIG. 7B, the exposed high voltage gate insulating layer 105 is etched using the photoresist pattern 50 as an etch mask to form the high voltage gate insulating pattern 110. For this, an isotropic etch method or an anisotropic etch method may be used. FIGS. 8A through 8D are cross-sectional views explaining a method for forming the high voltage gate insulating pattern 110 of FIG. 1 according to another embodiment. Referring to FIG. 8A, a mask layer 60 where a lower mask layer 62, an intermediate mask layer 64 and an upper mask layer 66 are sequentially stacked is formed on the semiconductor substrate 100.

The lower mask layer 62 is preferably made of a silicon oxide layer formed by a thermal oxidization process. The silicon oxide layer may be formed by a CVD method. Preferably, the intermediate mask layer 64 and the upper mask layer 66 are made of a silicon nitride layer and a silicon oxide layer formed by the CVD method, respectively.

A photoresist pattern 55 is formed on the mask, layer 60 to expose the upper mask layer 66 in the high voltage transistor region.

Referring to FIG. 8B, the exposed upper mask layer 66 is etched using the photoresist pattern 55 as an etch mask. Thus, the upper mask pattern 67 is formed to expose the intermediate mask layer 64 in the high voltage transistor region.

The etching process for forming the upper mask pattern 67 may be performed by an isotropic etch method or an anisotropic etch method. Thereafter, the photoresist pattern 55 is removed to expose the upper mask pattern 67.

Referring to FIG. 8C, the exposed intermediate mask layer 64 is etched using the upper mask pattern 67 as an etch mask. Thus, an intermediate mask pattern 65 is formed to expose the lower mask layer 62 in the high voltage transistor region.

The exposed lower mask layer 62 is etched using the intermediate mask pattern 65 as an etch mask. Accordingly, a lower mask pattern 63 is formed to expose the semiconductor substrate 100 in the high voltage transistor region.

Preferably, the etching process for forming the intermediate mask pattern 65 is performed using phosphoric acid as an etchant by the isotropic etch method. Also, the etching process for forming the lower mask pattern 63 is preferably performed using an etch recipe having an etch selectivity with respect to the semiconductor substrate 100 by the isotropic etch method.

The high voltage gate insulating pattern 110 is formed at the exposed semiconductor substrate 100. Preferably, the high voltage gate insulating pattern 110 is formed by the thermal oxidization process. Here, the high voltage gate insulating pattern 110 is not formed at the low voltage transistor region and the cell array region by the remaining lower mask pattern 63 and the remaining intermediate mask pattern 65.

Referring to FIG. 8D, the remaining lower mask pattern 63 and the remaining intermediate mask pattern 65 are removed. Here, it is preferable that the isotropic etch method is performed using phosphoric acid and fluoric acid as an etchant for removing the intermediate mask pattern 65 and the lower mask pattern 63, respectively.

FIGS. 9A through 9C, 10A through 10C, 11A through 11C, 12A through 12C, 13A through 13C, and 14A through 14C are cross-sectional views explaining in detail modified embodiments regarding types of the sacrificial pattern 200 of FIG. 4.

Figure 9A:
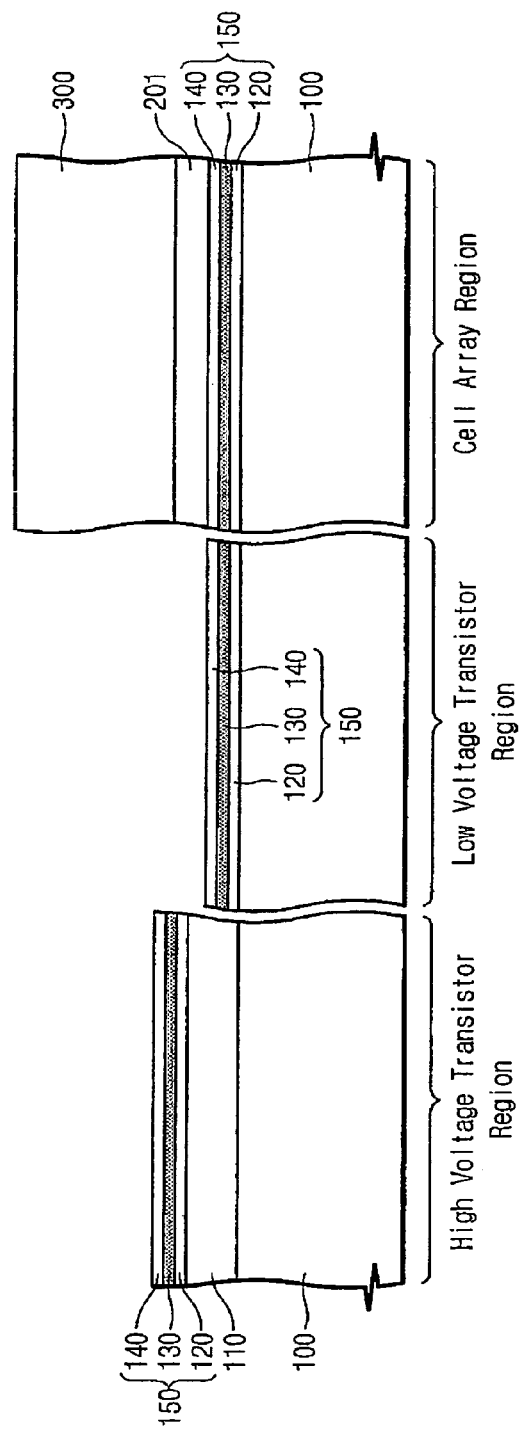
Figure 9B:
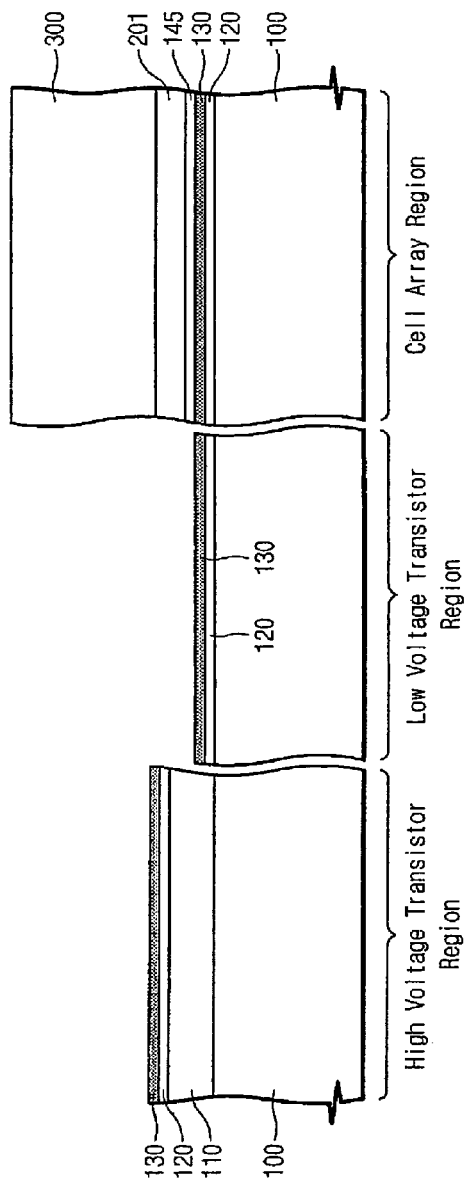
Figure 9C:
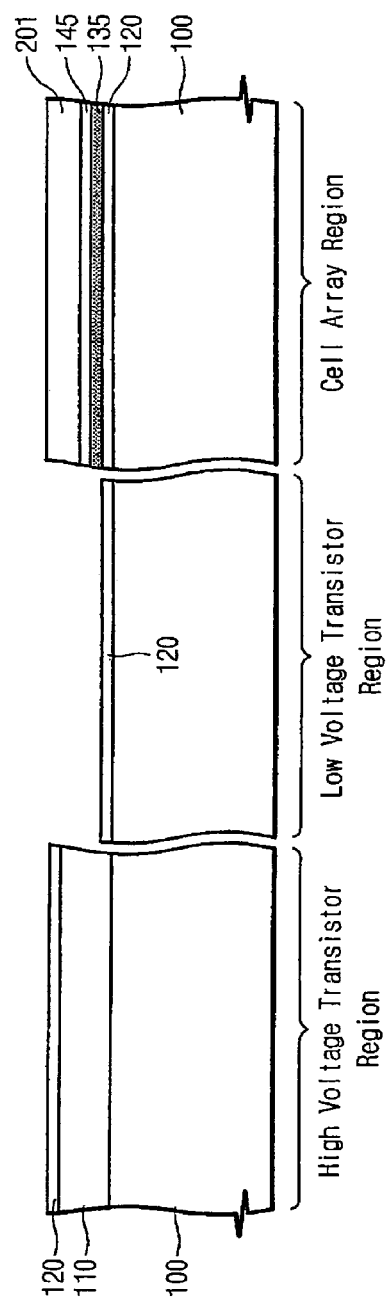

FIGS. 9A through 9C are cross-sectional views showing the embodiment of using a silicon oxide layer as the sacrificial pattern 200.

Referring to FIGS. 1 and 9A, the silicon oxide layer is formed on the cell gate insulating layer 150 to be used as the sacrificial pattern 200. A photoresist pattern 300 is formed on the silicon oxide layer, leaving the peripheral circuit region exposed. The silicon oxide layer is patterned using the photoresist pattern 300 as an etch mask to form a silicon oxide pattern 201. The silicon oxide pattern 201 exposes the upper insulating layer 140 in the peripheral circuit region.

At this time, the silicon oxide layer is preferably formed by the CVD method. Also, it is preferable to use the anisotropic etch method for forming the silicon oxide pattern 201. The isotropic etch method may be performed using fluoric acid.

Referring to FIG. 7B, the exposed upper insulating layer 140 is etched using the photoresist pattern 300 as an etch mask. Accordingly, the upper insulating pattern 145 is formed to expose the charge storage layer 130 in the peripheral circuit region. In consideration of the etch characteristics according to types of the material layers of the table 1,the etching process for forming the upper insulating pattern 145 is preferably performed by Low Ammoniumflouride Liquid (LAL) or by using sulphuric acid as an etchant. The etching process may be carried out by the anisotropic etch method.

The upper insulating pattern 145 may be formed by implementing an over etch method for forming the silicon oxide pattern 201 described in FIG. 9A. In this case, the over etch method is preferably performed using LAL.

Referring to FIGS. 5 and 9C, the photoresist pattern is removed to expose the silicon oxide pattern 201 at the cell array region. The exposed charge storage layer 130 is etched using the silicon oxide pattern 201 as an etch mask. Accordingly, a charge storage pattern 135 is formed to expose a lower insulating layer 120 in the peripheral circuit region. The etching process for forming the charge storage pattern 135 is preferably performed by using phosphoric acid as the etchant.

Thereafter, the exposed lower insulating layer 120 is etched to form the lower insulating pattern 125 exposing the semiconductor substrate 100 in the low voltage transistor region. The etching process for forming the lower insulating pattern 125 is performed so that the silicon oxide pattern 201 is also etched. For this, it is preferable to use a wet etch method using fluoric acid as the etchant. As shown in the table 1, the upper insulating pattern 145 made of the metal oxide layer has an excellent etch selectivity with respect to the fluoric acid. Accordingly, the cell gate insulating pattern 155 may be formed without etch damage. As a result, the structure of FIG. 5 is formed.

Meanwhile, the etching process for forming the lower insulating pattern 125 may be implemented so that the silicon oxide pattern 201 may remain over the upper insulating pattern 145. For this, preferably, the silicon oxide layer is thicker than the lower insulating layer 120.

Figure 10B:
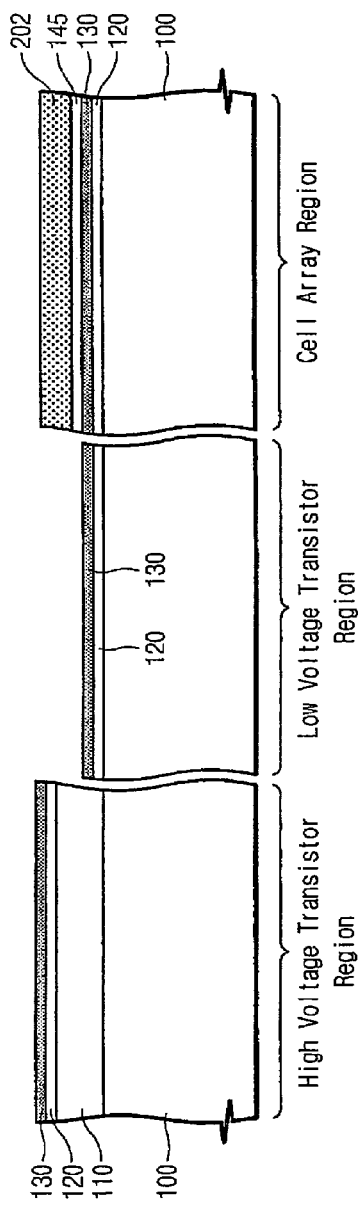
Figure 10C:
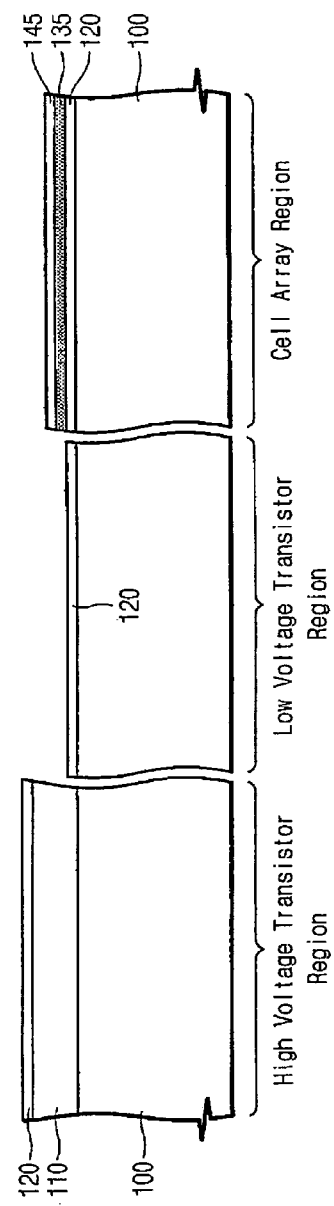

FIGS. 10A through 10C are cross-sectional views showing the embodiment of using a silicon nitride layer as the sacrificial pattern 200.

Referring to FIGS. 1 and 10A, the silicon nitride layer is formed on the cell gate insulating layer 150 to be used as the sacrificial pattern 200. The photoresist pattern 300 is formed on the silicon nitride layer to expose the peripheral circuit region. The silicon nitride layer is patterned using the photoresist pattern 300 as an etch mask to form a silicon nitride pattern 202. The silicon nitride pattern 202 exposes the upper insulating layer 140 in the peripheral circuit region.

At this time, the silicon nitride layer is preferably formed by the CVD method. Also, it is preferable to use the anisotropic etch method for forming the silicon nitride pattern 202. Referring to FIG. 10B, the exposed upper insulating layer 140 is etched using the photoresist pattern 300 as an etch mask. Accordingly, the upper insulating pattern 145 is formed to expose the charge storage layer 130 in the peripheral circuit region. In consideration of the etch characteristics according to types of material layers of the table 1, the etching process for forming the upper insulating pattern 145 is preferably performed using LAL or using sulphuric acid as an etchant.

Continuously, the photoresist pattern 300 is removed to expose the silicon nitride pattern 202 in the cell array region.

Referring to FIGS. 5 and 10C, the exposed silicon nitride pattern 202 and the exposed charge storage layer 130 are etched. Accordingly, the charge storage pattern 135 is formed to expose the lower insulating layer 120 in the peripheral circuit region. Further, a top surface of the upper insulating pattern 145 is exposed. The etching process for forming the charge storage pattern 135 is preferably performed by using phosphoric acid as the etchant.

Thereafter, the exposed lower insulating layer 120 is etched to form the lower insulating pattern 125 exposing the semiconductor substrate 100 in the low voltage transistor region. Preferably, the etching process for forming the lower insulating pattern 125 is performed by the wet etch method of using fluoric acid as the etchant. Here, the upper insulating pattern 145 made of the metal oxide layer has an excellent etch selectivity with respect to the fluoric acid. As a result, the resultant structure of FIG. 5 is formed.

The embodiment explained in FIGS. 10A through 10C may be equally applied to the case of using a silicon oxynitride layer as the sacrificial pattern 200.

FIGS. 11A through 11C are cross-sectional views showing the embodiment of using a silicon oxide layer and a silicon nitride layer that are sequentially stacked as the sacrificial pattern 200.

Referring to FIGS. 1 and 11A, the silicon oxide layer and the silicon nitride layer are sequentially formed on the cell gate insulating layer 150 to be used as the sacrificial pattern 200. The photoresist pattern 300 is formed on the silicon nitride layer to expose the peripheral circuit region. The silicon nitride layer and the silicon oxide layer are sequentially patterned using the photoresist pattern 300 as an etch mask. Accordingly, the sacrificial pattern 200 is formed to expose the upper insulating layer 140 in the peripheral circuit region. The sacrificial pattern 200 is comprised of a silicon oxide pattern 203 and a silicon nitride pattern 204 that are sequentially stacked on the upper insulating layer.

At this time, the silicon oxide layer and the silicon nitride layer are preferably formed by the CVD method. Also, it is preferable to use the anisotropic etch method for forming the sacrificial pattern 200.

Referring to FIG. 11B, the exposed upper insulating layer 140 is etched using the photoresist pattern 300 as an etch mask. Accordingly, the upper insulating pattern 145 is formed to expose the charge storage layer 130 in the peripheral circuit region. The etching process for forming the upper insulating pattern 145 is preferably performed using LAL or by using sulphuric acid as an etchant. The etching process may be implemented by the anisotropic etch method. Also, the upper insulating pattern 145 may be formed by the over-etch method of FIG. 9A.

Continuously, the photoresist pattern 300 is removed to expose the silicon nitride pattern 204 in the cell array region.

Referring to FIGS. 5 and 11C, the exposed silicon nitride pattern 204 and the exposed charge storage layer 130 are etched. Accordingly, the charge storage pattern 135 is formed under the upper insulating pattern 145 to expose the lower insulating layer 120 in the peripheral circuit region. Further, a top surface of the silicon oxide pattern 203 is exposed. The etching process for forming the charge storage pattern 135 is preferably performed by using phosphoric acid as the etchant.

Thereafter, the exposed lower insulating layer 120 and the exposed silicon oxide pattern 203 are etched to expose the semiconductor substrate 100 in the low voltage transistor region and the upper insulating pattern 145. This etching process is the same as that in FIG. 9C.

FIGS. 12A through 12C are cross-sectional views showing the embodiment of using a silicon nitride layer and a silicon oxide layer that are sequentially stacked as the sacrificial pattern 200.

Referring to FIGS. 1 and 12A, the silicon nitride layer and the silicon oxide layer are sequentially formed on the cell gate insulating layer 150. The photoresist pattern 300 is formed on the silicon oxide layer to expose the peripheral circuit region. The silicon nitride layer and the silicon oxide layer are successively patterned using the photoresist pattern 300 as an etch mask. Accordingly, the sacrificial pattern 200 is formed to expose the upper insulating layer 140 in the peripheral circuit region. The sacrificial pattern 200 is comprised of a silicon nitride pattern 205 and a silicon oxide pattern 206, which are sequentially stacked on the upper insulating layer 140.

At this time, the silicon nitride layer and the silicon oxide layer are preferably formed by the CVD method. Also, it is preferable to use the anisotropic etch method for forming the sacrificial pattern 200.

Referring to FIG. 12B, the photoresist pattern 300 is removed to expose the silicon oxide pattern 206. Next, the exposed upper insulating layer 140 and the exposed silicon oxide pattern 206 are etched. Accordingly, the upper insulating pattern 145 is formed to expose the charge storage layer 130 in the peripheral circuit region. Also, the silicon nitride pattern 205 is exposed at the cell array region. The etching process for forming the upper insulating pattern 145 is preferably performed by using LAL or by using sulphuric acid as the etchant. The etching process may be implemented by the anisotropic etch method.

Referring to FIG. 12C, the exposed silicon nitride pattern 205 and the exposed charge storage layer 130 are etched. This etching process is the same as that in FIG. 10C.

FIGS. 11A through 13C are cross-sectional views showing the embodiment using a silicon oxide layer, a silicon nitride layer and a silicon oxide layer that are sequentially stacked as the sacrificial pattern 200.

Figure 13A:
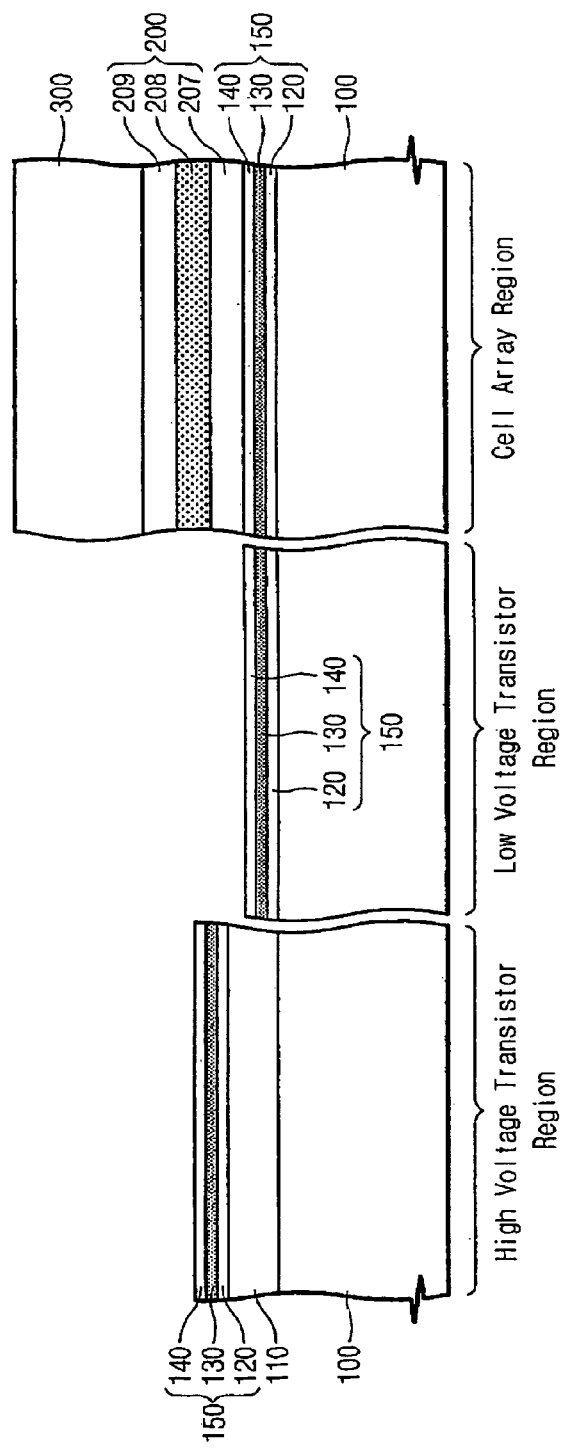

Referring to FIGS. 1 and 13A, the lower silicon oxide layer, the silicon nitride layer and the upper silicon oxide layer are sequentially formed on the cell gate insulating layer 150 to be used as the sacrificial pattern 200. The photoresist pattern 300 is formed on the upper silicon oxide layer to expose the peripheral circuit region. The upper silicon oxide layer, the silicon nitride layer and the lower silicon oxide layer are successively patterned using the photoresist pattern 300 as an etch mask. Accordingly, the sacrificial pattern 200 is formed to expose the upper insulating layer 140 in the peripheral circuit region. Also, the sacrificial pattern 200 is comprised of a lower silicon oxide pattern 207, a silicon nitride pattern 208 and an upper silicon oxide pattern 209, which are sequentially stacked on the upper insulating layer 140.

At this time, the upper silicon oxide pattern 209, the lower silicon oxide pattern 207 and the silicon nitride pattern 208 are preferably formed by the CVD method. The etching process for forming the sacrificial pattern 200 may be performed by the anisotropic etch method or the isotropic etch method.

Referring to FIG. 13B, the photoresist pattern 300 is removed to expose the upper silicon oxide pattern 209. Next, the exposed upper insulating layer 140 and the exposed upper silicon oxide pattern 209 are etched. Accordingly, the upper insulating pattern 145 is formed to expose the charge storage layer 130 in the peripheral circuit region. Also, the silicon nitride pattern 208 is exposed at the cell array region. The etching process for forming the upper insulating pattern 145 is preferably performed by the isotropic etch method using LAL as the etchant. The isotropic etch method is capable of etching the metal oxide layer as well as the silicon oxide layer. Also, the upper insulating pattern 145 may be formed by the over etch method of FIG. 9A.

Referring to FIGS. 5 and 13C, the exposed silicon nitride pattern 208 and the exposed charge storage layer 130 are etched. Accordingly, the charge storage pattern 135 is formed under the upper insulating pattern 145 to expose the lower insulating layer 120 in the peripheral circuit region. Further, a top surface of the lower silicon oxide pattern 207 is exposed. The etching process for forming the charge storage pattern 135 is preferably performed by using phosphoric acid as the etchant.

Thereafter, the exposed lower insulating layer 120 and the exposed lower silicon oxide pattern 207 are etched to expose the semiconductor substrate 100 in the low voltage transistor region and the upper insulating pattern 145. Thus, the lower insulating pattern 125 is formed under the charge storage pattern 135. Also, a top surface of the upper insulating pattern 145 is exposed. The etching process for forming the lower insulating pattern 125 is preferably performed by the wet etch method using fluoric acid as the etchant. This etching process is the same as described in FIG. 9C.

Figure 14A:
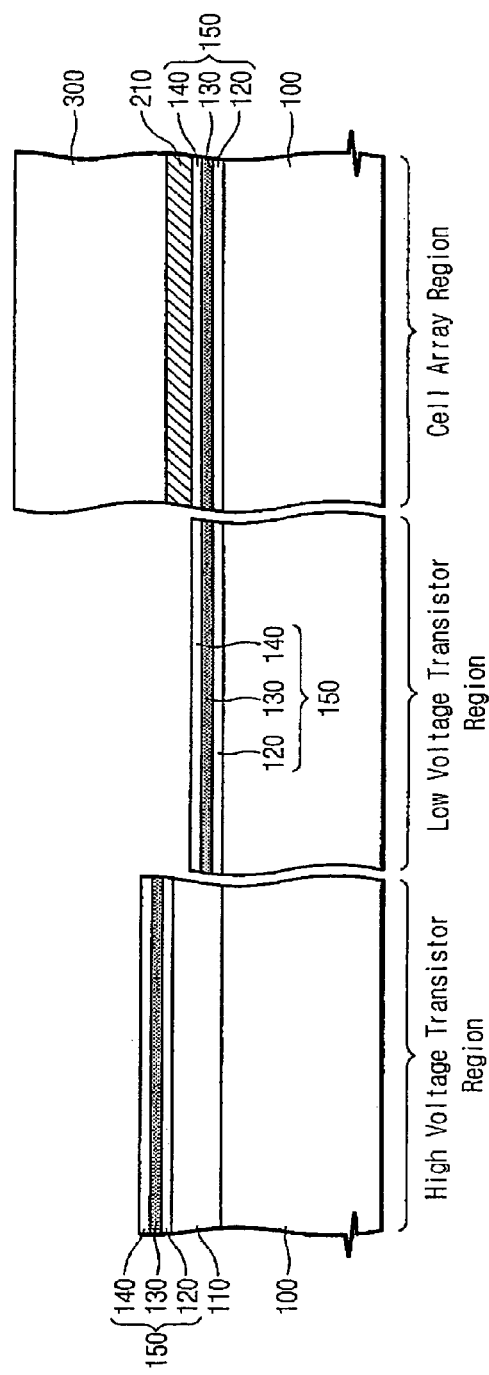
Figure 14B:
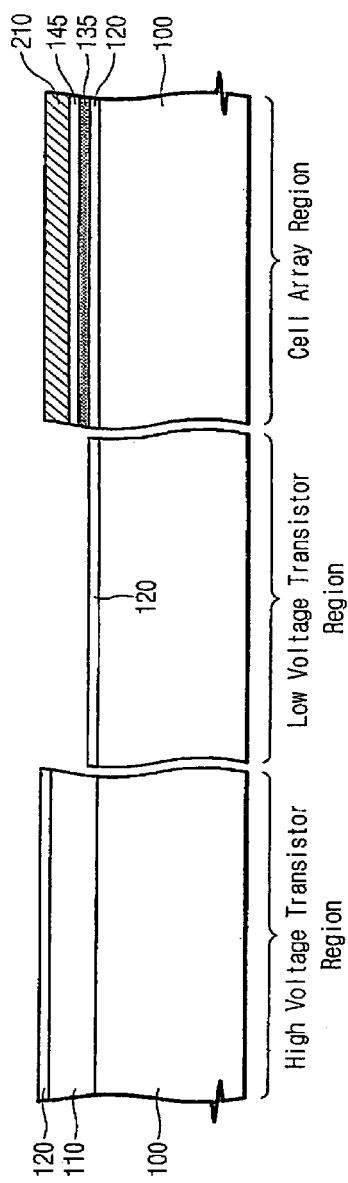
Figure 14C:
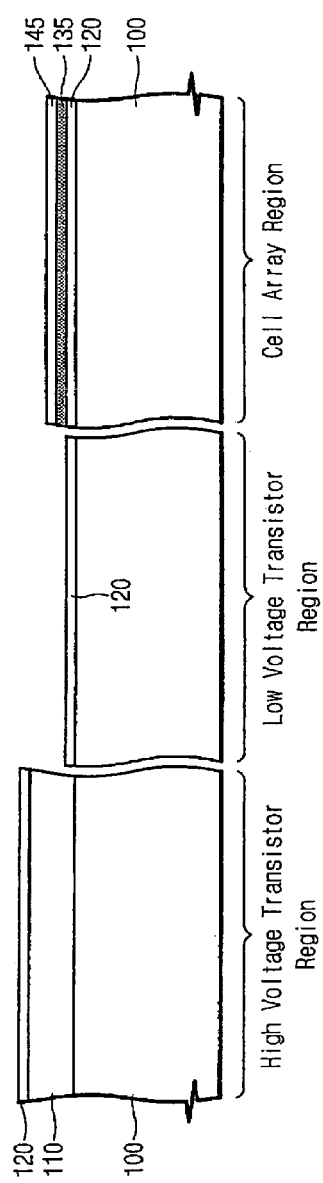
Figure 15:
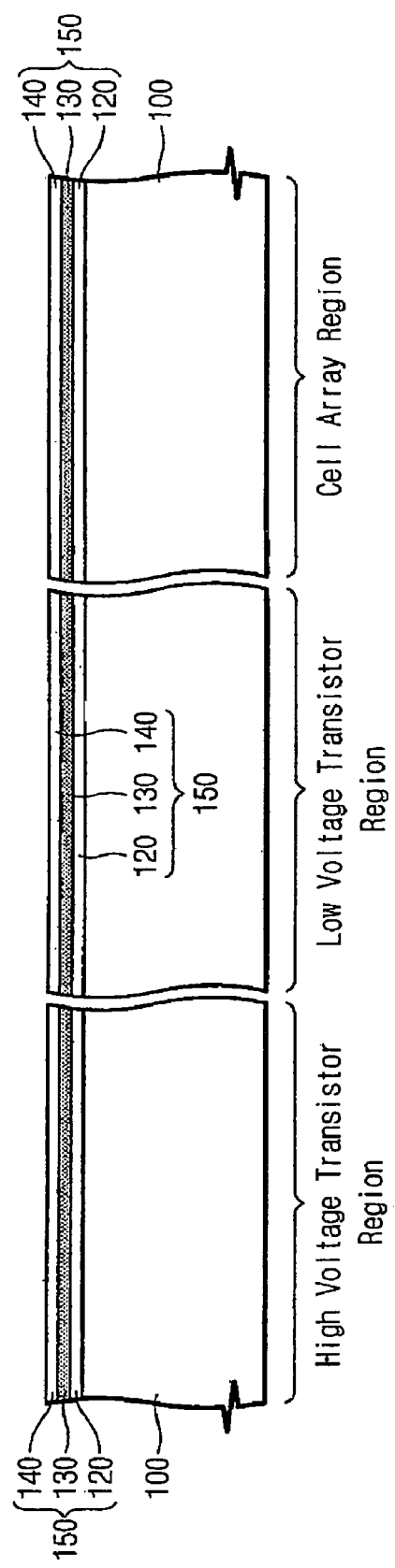
Figure 16:
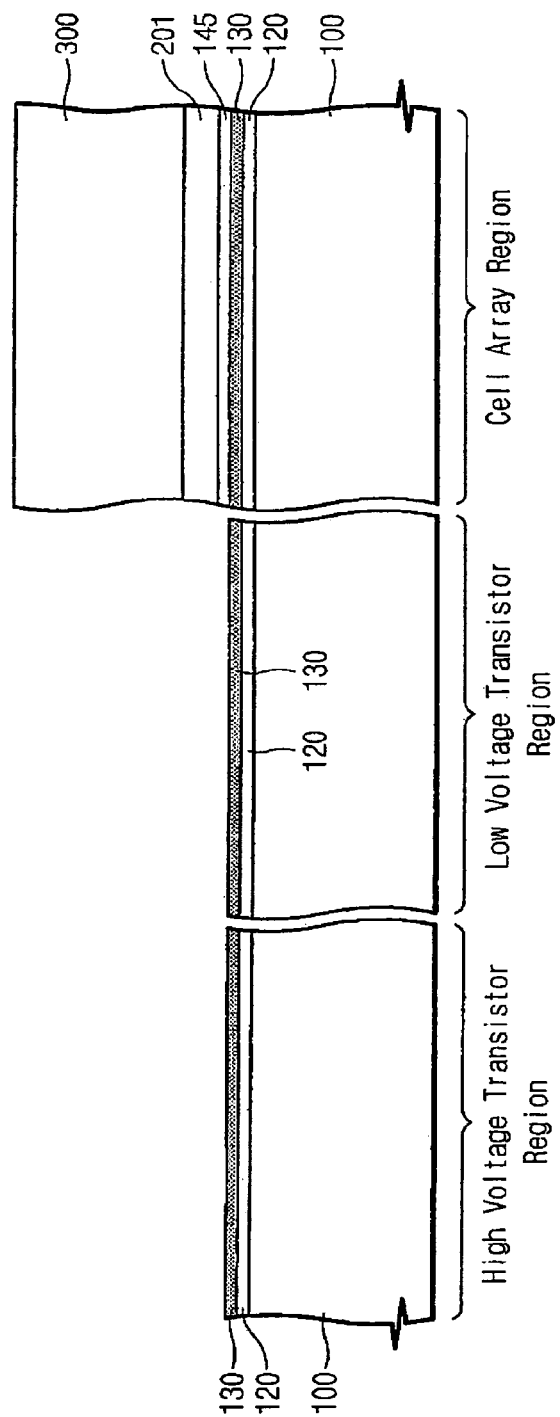
Figure 21:
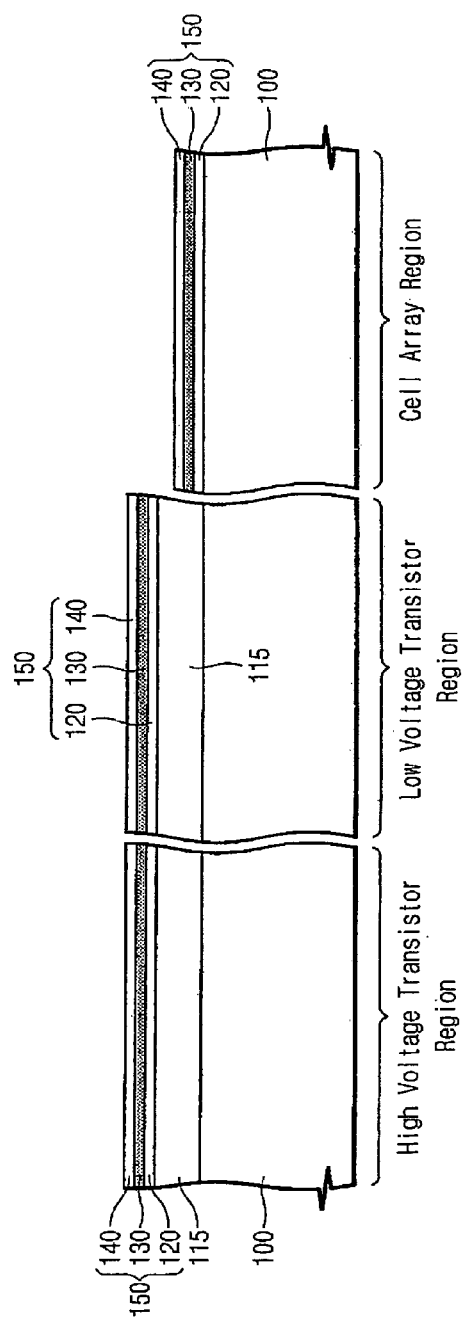
FIGS. 21 through 26 are cross-sectional views showing a method of forming the gate insulating layer of the nonvolatile memory device according to still another preferred embodiment of the invention.
Figure 22:
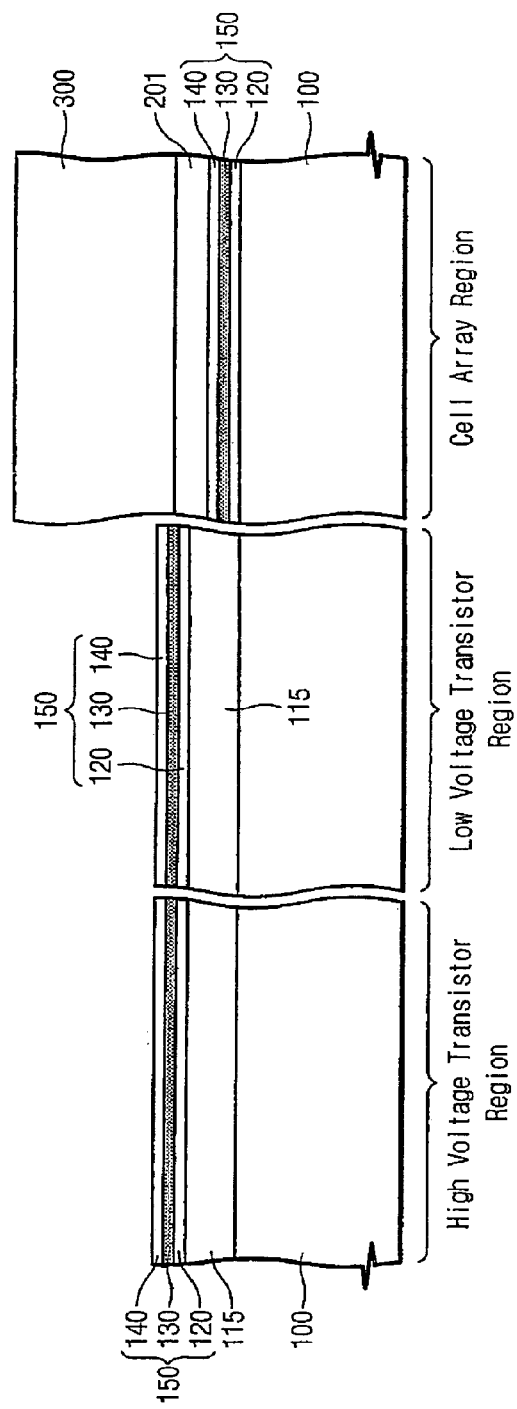
Figure 23:
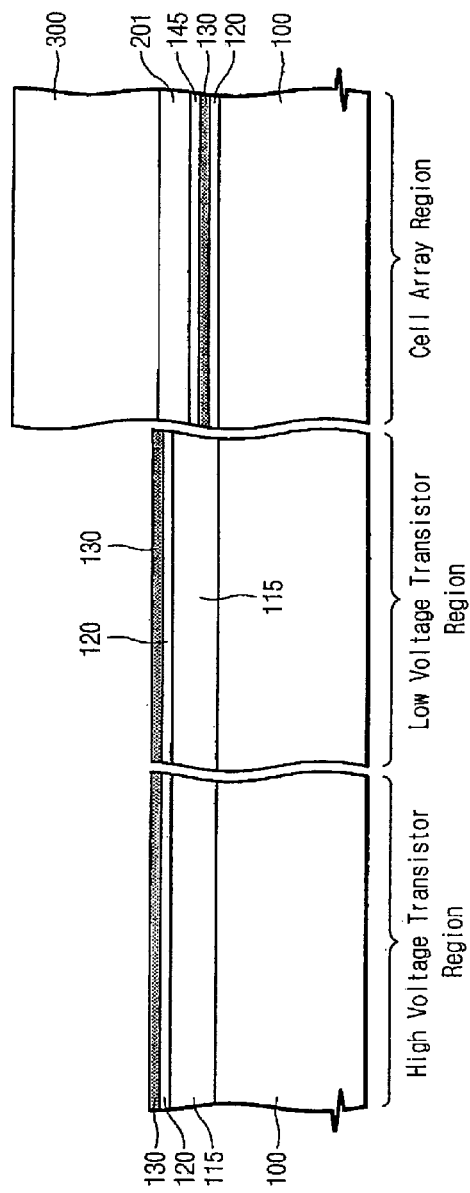
Figure 24:
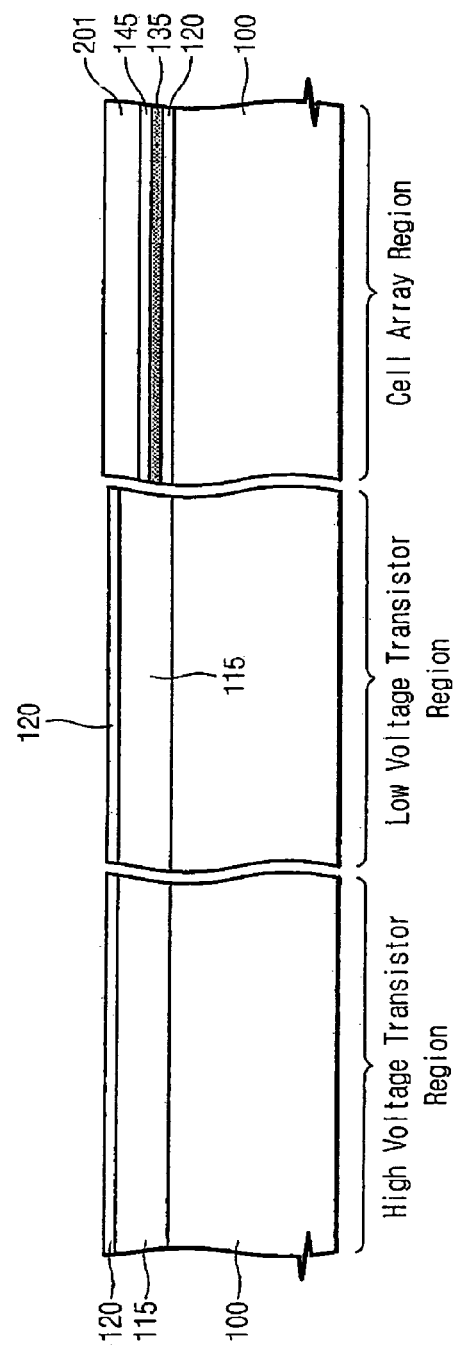

FIGS. 14A through 14C are cross-sectional views showing the embodiment of using a polysilicon layer as the sacrificial pattern 200.

Referring to FIGS. 1 and 14A, the polysilicon layer is formed on the cell gate insulating layer 150 to be used as the sacrificial pattern 200. The photoresist pattern 300 is formed on the polysilicon layer to expose the peripheral circuit region. The polysilicon layer is patterned using the photoresist pattern 300 as an etch mask to form a polysilicon pattern 210 exposing the upper insulating layer 140 in the peripheral circuit region.

At this time, the polysilicon layer is preferably formed by the CVD method. Also, it is preferable to use the anisotropic etch method for forming the polysilicon pattern 210. Referring to FIG. 14B, the exposed upper insulating layer 140 is etched using the photoresist pattern 300 as an etch mask. Accordingly, the upper insulating pattern 145 is formed to expose the charge storage layer 130 in the peripheral circuit region. In consideration of the etch characteristics according to types of material layers of the table 1, the etching process for forming the upper insulating pattern 145 is preferably performed using LAL or by using sulphuric acid.

Continuously, the photoresist pattern 300 is removed to expose the polysilicon pattern 210 in the cell array region. The charge storage layer 130 is etched using the polysilicon pattern 210 as an etch mask. Thus, the charge storage pattern 135 is formed to expose the lower insulating layer 120 in the peripheral circuit region. Preferably, the etching process for forming the charge storage pattern 135 is performed by using phosphoric acid as the etchant.

Referring to FIGS. 5 and 14C, the exposed polysilicon pattern 210 is etched to expose the upper insulating pattern 145. Preferably, the process of removing the polysilicon pattern 210 is carried out using mixtures of nitric acid, fluoric acid and acetic acid as the etchant. The nitric acid serves to oxidize the polysilicon pattern 210 to form a silicon oxide layer. The fluoric acid serves to remove the polysilicon pattern 210. The acetic acid serves to dilute the etchant and serves as a catalyst accelerate an oxidization of the polysilicon pattern 210.

Meanwhile, the lower insulating layer 120 exposed by the fluoric acid is also etched. Thus, the lower insulating pattern 125 is formed to expose the semiconductor substrate 100 in the low voltage transistor region. Here, the upper insulating pattern 145 made of a metal oxide layer is not etched during the etching process. As a result, the resultant structure of FIG. 5 is formed.

FIGS. 15 through 20 are cross-sectional views showing a method of forming a gate insulating layer of a nonvolatile memory device according to another embodiment of the invention.

Referring to FIGS. 15 through 20, the cell gate insulating pattern 150 is formed on the semiconductor substrate 100. In the cell gate insulating pattern 150, the lower insulating layer 120, the charge storage layer 130 and the upper insulating layer 140 are sequentially stacked. Next, the high voltage gate insulating layer 116 is formed. That is, when the embodiment is compared with the embodiment of FIGS. 1 through 6, the process order of forming the cell gate insulating pattern 150 and the high voltage gate insulating pattern 110 is altered.

In the embodiment illustrated in FIGS. 15 through 20, the silicon oxide pattern 201 is used as the sacrificial pattern. The steps in FIGS. 15 through 20 are the same as those in FIGS. 9A through 9C, so that description of those steps will be omitted here. Further, the sacrificial pattern may be formed of a silicon oxide layer and a silicon nitride layer that are sequentially stacked, or a silicon oxide layer, a silicon nitride layer and a silicon oxide layer that are sequentially stacked. A method of utilizing these layers is the same as described in FIGS. 11A through 11C and 13A through 13C. In each of the cases, a silicon oxynitride layer may be used instead of the silicon nitride layer.

However, the process of the embodiment is preferably performed so that a silicon oxide pattern 201' used as the sacrificial pattern remains over the cell gate insulating pattern 155. The method of retaining the sacrificial pattern is the same as described in FIG. 9C. Therefore, it is possible to prevent a conventional problem caused by bringing the cell gate insulating pattern 155 into contact with the photoresist pattern. That is, referring to FIGS. 19 and 20, in order to form the low voltage gate insulating layer 190 at the low voltage transistor region, a photoresist pattern (not shown) is formed to expose the low voltage transistor region. But, the cell gate insulating pattern 155 is not in contact with the photoresist pattern by the remaining silicon oxide pattern 201'. Thereafter, the low voltage gate insulating layer 190 is formed at the exposed low voltage transistor region.

FIGS. 21 through 26 are cross-sectional views showing a method of forming a gate insulating layer of a nonvolatile memory device according to still another preferred embodiment of the invention. Before the cell gate insulating layer 150 is formed, the high voltage gate insulating layer 115 is formed at the high voltage transistor region as well as at the low voltage transistor region.

Referring to FIGS. 21 through 24, a silicon oxide layer is used as the sacrificial pattern. The lower insulating layer 120 in the peripheral circuit region is exposed using an etch selectivity between the cell gate insulating layer 150 and the silicon oxide pattern 201 used as the sacrificial pattern. This method is the same as described in FIGS. 9A through 9C.

Figure 25:
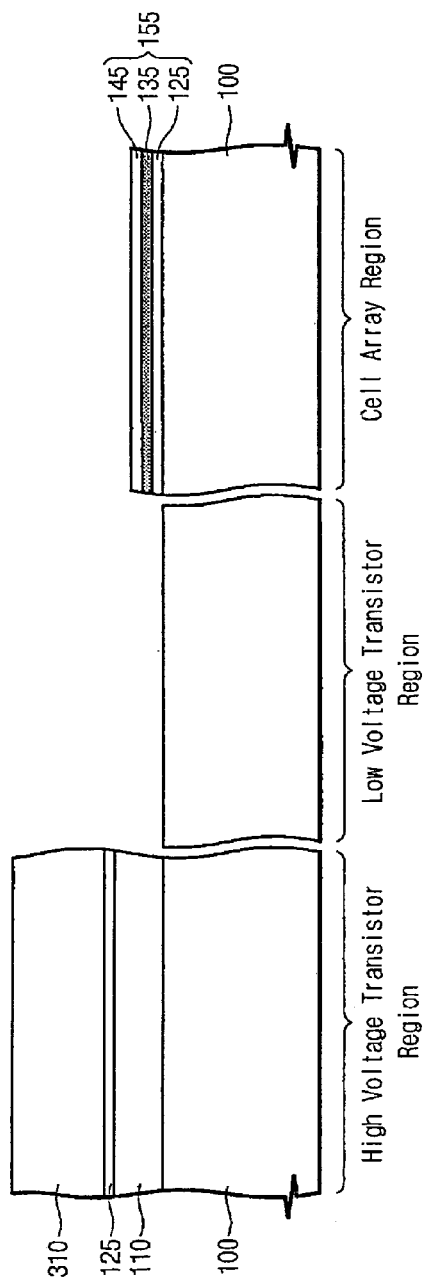

Referring to FIG. 25, a photoresist pattern 310 is formed on the exposed lower insulating layer 120 to cover the high voltage transistor region. The silicon oxide pattern 201, the lower insulating layer 120 in the low voltage transistor region and the high voltage gate insulating layer 115 are etched using the photoresist pattern 310 as an etch mask. Accordingly, the high voltage gate insulating pattern 110 and the lower insulating pattern 125 are sequentially stacked at the high voltage transistor region. Here, the upper insulating pattern 145 in the cell array region is exposed. Also, the semiconductor substrate 100 in the low voltage transistor region is exposed.

Figure 26:
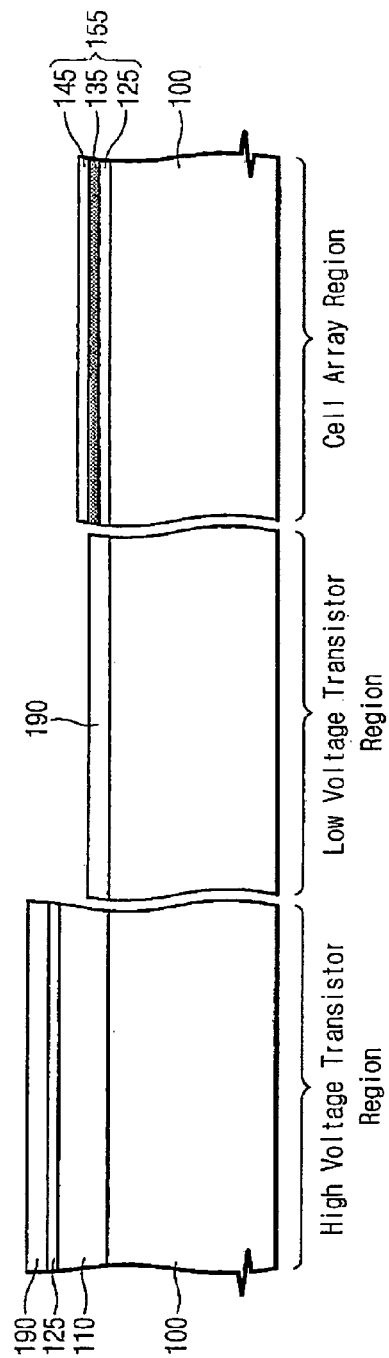

Referring to FIG. 26, the photoresist pattern 310 is removed. Next, the low voltage gate insulating layer 190 is formed at the low voltage transistor region by a thermal oxidization process. At this time, as described in FIG. 6, the low voltage gate insulating layer 190 is formed on the lower insulating pattern 125 in the high voltage transistor region. However, the low voltage gate insulating layer 190 is not formed at the cell array region.

As described in FIGS. 9 through 14, one material layer selected from the group consisting of a silicon oxide layer, a silicon nitride layer, a silicon oxynitride layer and polysilicon layer may be used as the sacrificial pattern. Also, as described in FIGS. 9C, 11C and 13C, this embodiment may be carried out so that the silicon oxide pattern may remain over the cell array region.

Further, a method of forming the gate insulating layer according to still another embodiment of the invention includes sequentially forming a high voltage gate insulating pattern and a low voltage gate insulating layer. Next, a cell gate insulating pattern is formed at the cell array region. Forming the cell gate insulating pattern includes removing the cell gate insulating layer in the high voltage transistor region and the low voltage transistor region. Description of those steps is the same as those in the foregoing embodiment, so that they will be omitted here.

According to the invention, the sacrificial pattern is formed on the cell gate insulating layer formed of the lower insulating layer, the charge storage layer and the upper insulating layer, which are sequentially stacked. The sacrificial pattern has an etch selectivity with respect to the upper insulating layer. The sacrificial pattern may prevent the upper insulating layer from being in contact with the photoresist pattern. As a result, it is possible to minimize the damage or thickness variation of the upper insulating layer.

Also, by using the etch selectivity between the upper insulating layer and the sacrificial pattern, damage to the upper insulating layer may be prevented and the semiconductor substrate in the peripheral circuit region may be exposed. Accordingly, it is possible to form the gate insulating layers (i.e., the cell gate insulating pattern, the high voltage gate insulating pattern and the low voltage gate insulating pattern) having three different thicknesses so as to have stable characteristics.

Specific features of embodiments of the invention will now be disclosed.

A feature of the invention is to provide a method of forming a trap type flash memory device having gate insulating layers with three different thicknesses.

Another feature of the invention is to provide a method of forming the trap type flash memory device capable of preventing the damage of cell gate insulating layers.

According to an aspect of the invention, a method of fabricating a trap type flash memory device includes forming a sacrificial layer having an etch selectivity with respect to a cell gate insulating layer. The method includes forming the cell gate insulating layer on a semiconductor substrate with a peripheral circuit region composed of a high voltage transistor region and a low voltage transistor region, and a cell array region. Next, a sacrificial pattern is formed on the cell gate insulating layer to cover the cell array region. Thereafter, the cell gate insulating layer in the peripheral circuit region is etched using the sacrificial pattern as a sacrificial etch mask to expose the peripheral circuit region. Here, the cell gate insulating layer is composed of a lower insulating layer, a charge storage layer, and an upper insulating layer that are sequentially stacked. The upper insulating layer and the sacrificial pattern are made of material layers having an etch selectivity with respect to each other.

Preferably, the lower insulating layer and the charge storage layer are made of a silicon oxide layer and a silicon nitride layer, respectively. Also, the upper insulating layer is made of a metal oxide layer having an etch selectivity with respect to the sacrificial pattern. Preferably, the upper insulating layer is composed of one selected from the group consisting of a high-k dielectric such as an aluminum oxide layer, a hafnium oxide layer, a hafnium aluminum oxide layer, and a hafnium silicon oxide layer. In addition, the upper insulating layer may include at least one element selected from Group IV of a periodic table as impurities. Also, after forming the cell gate insulating layer, a thermal process may be further performed in order to crystallize the upper insulating layer.

Preferably, the sacrificial pattern is composed of at least one material selected from the group consisting of a silicon oxide layer, a silicon nitride layer, a silicon oxynitride layer, and a polysilicon layer. While the sacrificial pattern is formed, the sacrificial layer and a photoresist layer are sequentially formed on the cell gate insulating layer. Next, the photoresist layer is patterned to form a photoresist pattern exposing the sacrificial layer in the peripheral circuit region. Thereafter, the exposed sacrificial layer is etched using the photoresist pattern as an etch mask. Here, the cell gate insulating layer in the peripheral circuit region is also etched.

While the cell gate insulating layer in the peripheral circuit region is etched, it is preferable that the upper insulating layer, the charge storage layer and the lower insulating layer are etched using sulphuric acid or LAL, phosphoric acid, and fluoric acid or LAL as an etchant, respectively. At this time, an isotropic etch method is preferably used for etching the lower insulating layer.

A process of etching the cell gate insulating layer is preferably carried out so that the sacrificial pattern may be removed or the sacrificial pattern may remain over the upper insulating layer. Here, removing the sacrificial pattern is preferably performed using an etch recipe having an etch selectivity with respect to the upper insulating layer.

The sacrificial pattern may be made of the silicon oxide layer. In this case, preferably, a step of etching the cell gate insulating layer includes sequentially etching the upper insulating layer and the charge storage layer by using the sacrificial pattern as an etch mask to expose the lower insulating layer. Next, the sacrificial pattern and the exposed lower insulating layer are etched.

The sacrificial pattern may be made of the silicon nitride layer. In this case, preferably, the step of etching the cell gate insulating layer includes etching the upper insulating layer by using the sacrificial pattern as an etch mask to expose the charge storage layer. Next, the sacrificial pattern and the exposed charge storage layer are etched to expose the upper insulating layer in the cell array region and the lower insulating layer in the peripheral circuit region. Thereafter, the exposed lower insulating layer is etched using an etch recipe having an etch selectivity with respect to the exposed upper insulating layer.

The sacrificial pattern may be composed of the silicon oxide layer and the silicon nitride layer, which are sequentially stacked. In this case, preferably, the step of etching the cell gate insulating layer includes etching the upper insulating layer by using the sacrificial pattern as an etch mask to expose the charge storage layer in the peripheral region. Thereafter, the silicon nitride layer and the exposed charge storage layer are etched to expose the silicon oxide layer in the cell array region and the lower insulating layer in the peripheral region. Thereafter, the exposed silicon oxide layer and the exposed lower insulating layer are etched.

The sacrificial pattern may be composed of the silicon nitride layer and the silicon oxide layer, which are sequentially stacked. In this case, preferably, the step of etching the cell gate insulating layer includes etching the silicon oxide layer and the upper insulating layer to expose the silicon nitride layer in the cell array region and the charge storage layer in the peripheral circuit region. Thereafter, the silicon nitride layer and the charge storage layer are etched to expose the upper insulating layer in the cell array region and the lower insulating layer in the peripheral circuit region. Thereafter, the exposed lower insulating layer is removed by using the etch recipe having the etch selectivity with respect to the exposed upper insulating layer.

The sacrificial pattern may be composed of a lower silicon oxide layer, the silicon nitride layer and an upper silicon oxide layer, which are sequentially stacked. In this case, preferably, the step of etching the cell gate insulating layer includes etching the upper silicon oxide layer and the upper insulating layer to expose the silicon nitride layer in the cell array region and the charge storage layer in the peripheral circuit region. Thereafter, the exposed silicon nitride layer and the exposed charge storage layer are etched to expose the lower silicon oxide layer in the cell array region and the lower insulating layer in the peripheral circuit region. Thereafter, the exposed lower silicon oxide layer and the exposed lower insulating layer are etched.

Before the cell gate insulating layer is formed, it is preferable to form a high voltage gate insulating pattern at the peripheral circuit region or the high voltage transistor region. After the peripheral circuit region is exposed, a low voltage gate insulating layer is formed at the exposed peripheral circuit region.

After exposing the peripheral circuit region or before forming the cell gate insulating layer, the high voltage gate insulating pattern and the low voltage gate insulating layer may be formed at the semiconductor substrate in the high voltage and low voltage transistor regions, respectively. A step of forming the high voltage gate insulating pattern and the low voltage gate insulating layer includes forming a high voltage gate insulating layer at the semiconductor substrate in the exposed peripheral circuit region. Next, the high voltage gate insulating layer is patterned to form the high voltage gate insulating pattern exposing the semiconductor substrate in the low voltage transistor region. Thereafter, the low voltage gate insulating layer is formed at the exposed semiconductor substrate in the low voltage transistor region.

In the drawings and specification, typical preferred embodiments of the invention have been disclosed and, although specific terms are employed, they are used in a generic and descriptive sense only and not for purpose of limitation, the scope of the invention being set forth in the following claims.

What is claimed is:

1. A method of forming a nonvolatile memory device on a semiconductor substrate with a peripheral circuit region composed of a high voltage transistor region and a low voltage transistor region and with a cell array region, comprising:

forming a cell gate insulating layer in contact with the semiconductor substrate at least in the cell array region, the cell gate insulating layer composed of a lower insulating layer, a charge storage layer, and an upper insulating layer that are sequentially stacked;

forming a sacrificial layer on the cell gate insulating layer, the sacrificial layer composed of at least one material having an etch selectivity with respect to the upper insulating layer;

forming a photoresist pattern exposing the sacrificial layer in the peripheral circuit region;

etching the exposed sacrificial region by using the photoresist pattern as an etch mask to form a sacrificial pattern covering the cell gate insulating layer in the cell array region; and simultaneously etching the cell gate insulating layer in the peripheral circuit region using the sacrificial pattern as a sacrificial etch mask.

2. The method as claimed in claim 1, wherein the lower insulating layer is made of a silicon oxide layer.

3. The method as claimed in claim 1, wherein the charge storage layer is made of a silicon nitride layer.

4. The method as claimed in claim 1, wherein the upper insulating layer is made of a metal oxide layer.

5. The method as claimed in claim 1, wherein the upper insulating layer is composed of one material selected from the group consisting of an aluminum oxide layer, a hafnium oxide layer, a hafnium aluminum oxide layer, and a hafnium silicon oxide layer.

6. The method as claimed in claim 1, wherein the upper insulating layer includes at least one impurity selected from the group consisting of elements from Group IV of the periodic table.

7. The method as claimed in claim 1, wherein the sacrificial pattern is composed of at least one material selected from the group consisting of a silicon oxide layer, a silicon nitride layer, a silicon oxynitride layer, and a polysilicon layer.

8. The method as claimed in claim 1, wherein the cell gate insulating layer in the peripheral circuit region is etched while the sacrificial layer is etched.

9. The method as claimed in claim 1, wherein etching the cell gate insulating layer in the peripheral circuit region comprises:
etching the upper insulating layer;
etching the charge storage layer by using phosphoric acid; and
etching the lower insulating layer.

10. The method of claim 9, wherein etching the upper insulating layer comprises etching the upper insulation layer with low ammonium liquid (LAL).

11. The method of claim 9, wherein etching the upper insulating layer comprises etching the upper insulation layer with sulphuric acid.

12. The method of claim 9, wherein etching the lower insulating layer comprises etching the lower insulating layer with low ammonium liquid (LAL).

13. The method of claim 9, wherein etching the lower insulating layer comprises etching the lower insulating layer with hydrofluoric acid.

14. The method as claimed in claim 9, wherein the lower insulating layer is etched using an isotropic etch method.

15. The method as claimed in claim 1, wherein etching the cell gate insulating layer comprises removing the sacrificial pattern using an etch recipe having an etch selectivity with respect to the upper insulating layer.

16. The method as claimed in claim 1, wherein the cell gate insulating layer is etched so that the sacrificial pattern remains over the upper insulating layer.

17. The method as claimed in claim 1, wherein the upper insulating layer is crystallized by a thermal process after the cell gate insulating layer is formed.

18. The method as claimed in claim 1, wherein the sacrificial pattern is made of a silicon oxide layer.

19. The method as claimed in claim 18, wherein etching the cell gate insulating layer comprises:
successively etching the upper insulating layer and the charge storage layer using the sacrificial pattern as an etch mask until the lower insulating layer is exposed; and
etching the sacrificial pattern and the lower insulating layer.

20. The method as claimed in claim 1, wherein the sacrificial pattern is made of a silicon nitride layer.

21. The method as claimed in claim 20, wherein etching the cell gate insulating layer in the peripheral circuit region comprises:
exposing the charge storage layer by etching the upper insulating layer using the sacrificial pattern as an etch mask;
exposing the upper insulating layer in the cell array region and the lower insulating layer in the peripheral circuit region by etching the sacrificial pattern and the charge storage layer; and
etching the lower insulating layer by using an etch recipe having an etch selectivity with respect to the exposed upper insulating layer.

22. The method as claimed in claim 1, wherein the sacrificial pattern is composed of a silicon oxide layer and a silicon nitride layer that are sequentially stacked.

23. The method as claimed in claim 22, wherein etching the cell gate insulating layer in the peripheral circuit region comprises:
exposing the charge storage layer in the peripheral circuit region by etching the upper insulating layer using the sacrificial pattern as an etch mask;
exposing the silicon oxide layer in the cell array region and the lower insulating layer in the peripheral circuit region by etching the silicon nitride layer and the charge storage layer; and
etching the silicon oxide layer and the lower insulating layer.

24. The method as claimed in claim 1, wherein the sacrificial pattern is composed of a silicon nitride layer and a silicon oxide layer that are sequentially stacked.

25. The method as claimed in claim 24, wherein etching the cell gate insulating layer in the peripheral circuit region comprises:
exposing the silicon nitride layer in the cell array region and the charge storage layer in the peripheral circuit region by etching the silicon oxide layer and the upper insulating layer;
exposing the upper insulating layer in the cell array region and the lower insulating layer in the peripheral circuit region by etching the silicon nitride layer and the charge storage layer; and
removing the lower insulating layer by using an etch recipe having an etch selectivity with respect to the upper insulating layer.

26. The method as claimed in claim 1, wherein the sacrificial pattern is composed of a lower silicon oxide layer, a silicon nitride layer, and an upper silicon oxide layer that are sequentially stacked.

27. The method as claimed in claim 26, wherein etching the cell gate insulating layer in the peripheral circuit region comprises:
exposing the silicon nitride layer in the cell array region and the charge storage layer in the peripheral circuit region by etching the upper silicon oxide layer and the upper insulating layer;
exposing the lower silicon oxide layer in the cell array region and the lower insulating layer in the peripheral circuit region by etching the silicon nitride layer and the charge storage layer; and
etching the lower silicon oxide layer and the lower insulating layer.

28. The method as claimed in claim 1, further comprising forming a high voltage gate insulating pattern at the peripheral circuit region before the cell gate insulating layer is formed.

29. The method as claimed in claim 1, further comprising forming a high voltage gate insulating pattern at the high voltage transistor region before the cell gate insulating layer is formed.

30. The method as claimed in claim 1, further comprising forming a low voltage gate insulating layer at the peripheral circuit region after the peripheral circuit region is exposed.

31. The method as claimed in claim 1, further comprising forming a high voltage gate insulating pattern and a low voltage gate insulating layer at the semiconductor substrate in the high voltage transistor region and in the low voltage transistor region, respectively, after the peripheral circuit region is exposed.

32. The method as claimed in claim 31, wherein forming the high voltage gate insulating pattern and the low voltage gate insulating layer comprises:
    forming a high voltage gate insulating layer at the semiconductor substrate in the peripheral circuit region that is exposed;
    patterning the high voltage gate insulating layer to form the high voltage gate insulating pattern exposing the semiconductor substrate in the low voltage transistor region; and
    forming the low voltage gate insulating layer on the semiconductor substrate that is exposed in the low voltage transistor region.

33. The method as claimed in claim 1, further comprising forming a high voltage gate insulating pattern and a low voltage gate insulating layer on the semiconductor substrate in the high voltage transistor region and in the low voltage transistor region, respectively, before the cell gate insulating layer is formed.

34. The method as claimed in claim 33, wherein forming the high voltage gate insulating pattern and the low voltage gate insulating layer comprises:
    forming a high voltage gate insulating layer at the semiconductor substrate in the peripheral circuit region that is exposed;
    patterning the high voltage gate insulating layer to form the high voltage gate insulating pattern exposing the semiconductor substrate in the low voltage transistor region; and
    forming the low voltage gate insulating layer on the semiconductor substrate that is exposed in the low voltage transistor region.

* * * * *

UNITED STATES PATENT AND TRADEMARK OFFICE
CERTIFICATE OF CORRECTION

PATENT NO. : 7,087,489 B2
APPLICATION NO. : 10/429153
DATED : August 8, 2006
INVENTOR(S) : Chang-Hyun Lee It is certified that error appears in the above-identified patent and that said Letters Patent is hereby corrected as shown below:

Column 4, line 36, the words "circuit insulating" should read -- circuit region and the sacrificial pattern 200 in the cell array region are etched. Thus, a cell gate insulating --;
Column 5, line 58, the word "mask," should read -- mask --;
Column 6, line 55, the words "FIG. 7B," should read -- FIG. 9B, --;
Column 14, line 64, the word "region" should read -- layer --;
Column 17, line 21, the word "at" should read -- on --;
Column 18, line 15, the words "layer at" should read -- layer on --.

Signed and Sealed this

Eighteenth Day of August, 2009

David J. Kappos
*Director of the United States Patent and Trademark Office*